(12) United States Patent
Fleisher et al.

(10) Patent No.: US 11,288,122 B1
(45) Date of Patent: Mar. 29, 2022

(54) HIGH AVAILABILITY STORAGE SYSTEM

(71) Applicant: Pavilion Data Systems, Inc., San Jose, CA (US)

(72) Inventors: Eugene Fleisher, San Jose, CA (US); Ray Siruno, San Jose, CA (US); Sundar Kanthadai, Fremont, CA (US); Venkeepuram R. Satish, Fremont, CA (US)

(73) Assignee: Pavilion Data System, Inc., San Jose, CA (US)

( * ) Notice: Subject to any disclaimer, the term of this patent is extended or adjusted under 35 U.S.C. 154(b) by 0 days.

(21) Appl. No.: 17/086,216

(22) Filed: Oct. 30, 2020

(51) Int. Cl.
| | |
|---|---|
| *G06F 11/10* | (2006.01) |
| *G06F 13/42* | (2006.01) |
| *G06F 1/26* | (2006.01) |
| *G06F 11/20* | (2006.01) |
| *G06F 13/40* | (2006.01) |
| *G06F 1/18* | (2006.01) |

(52) U.S. Cl.
CPC ........... *G06F 11/108* (2013.01); *G06F 1/18* (2013.01); *G06F 1/187* (2013.01); *G06F 1/266* (2013.01); *G06F 11/1096* (2013.01); *G06F 11/2089* (2013.01); *G06F 13/4063* (2013.01); *G06F 13/4204* (2013.01)

(58) Field of Classification Search
CPC .................................................. G06F 12/08
See application file for complete search history.

(56) References Cited

U.S. PATENT DOCUMENTS

| | | | |
|---|---|---|---|
| 10,452,279 B1 * | 10/2019 | Malwankar | G06F 3/0685 |
| 10,509,592 B1 | 12/2019 | Malwankar et al. | |
| 10,721,833 B1 * | 7/2020 | Meng | H05K 7/20136 |

\* cited by examiner

*Primary Examiner* — Jerry Wu
(74) *Attorney, Agent, or Firm* — Lowenstein Sandler LLP

(57) ABSTRACT

A storage server includes a plurality of solid state drives (SSDs), a plurality of input/output (IO) controllers, and a plurality of fabrics. Each fabric is configured to provide a fully connected mesh topology that connects each of the plurality of IO controllers to each of the plurality of SSDs. Each fabric comprises a management controller, a first switch layer comprising a first plurality of switches coupled to the plurality of IO controllers, and a second switch layer comprising a second plurality of switches coupled to a) the first plurality of switches and b) the plurality of SSDs, The first switch layer and the second switch layer together provide the fully connected mesh topology that connects every IO controller of the plurality of IO controllers to every SSD of the plurality of SSDs.

21 Claims, 12 Drawing Sheets

FIG. 2  PCIe Redundant Fabric Topology and Interconnect

ID OF TECHNOLOGY

HIGH AVAILABILITY STORAGE SYSTEM

FIELD OF TECHNOLOGY

This disclosure relates generally to the field of data storage and in particular to storage servers that use solid state storage devices.

BACKGROUND

Networked storage arrays may provide an enterprise level solution for secure and reliable data storage. Traditional storage servers include arrays of disk drives that are capable of performing about 100-10/000 input/output operations per second (IOPS). In traditional storage servers, a single processing device performs all physical to logic isolation and manages data accesses to all drives of a storage server. The single processing device is able to manage the IOPS for all of the disk drives without acting as a performance bottleneck.

With the introduction of solid state storage devices (e.g., solid state drives (SSDs) such as Flash drives), the speed of networked storage arrays has improved dramatically because a single SSD is capable of performing about 1 million IOPS. However, a single processing device is not generally capable of handling more than a few million IOPS, and so becomes a bottleneck when it manages the IOPS for multiple SSDs.

Storage servers are generally stored in racks at facilities that include many such storage servers. Traditionally, in order to service any component or module of a storage server the entire storage server needs to be removed from or pulled out of the rack. Additionally, all such components and modules of the storage server are generally only serviceable from the top of the storage server. Accordingly, to service any component or module of the storage server, it is removed from the rack, a cover is removed or opened, and the component or module is serviced from the top. This results in a storage server that is difficult to service.

Additionally, traditional storage servers include a high number (e.g., on the order of 30-60) of high-speed cables that connect to and project out of the back of the storage servers. The high-speed cables each need to be long enough to remain connected to the storage server when the storage server is removed from the rack for servicing. In order for the storage server to be serviceable, these high-speed cables therefore have an extra length to accommodate the removal of the storage servers from the rack, which consumes on average about an additional 10 inches of space behind the rack to accommodate the extra length of the cables. The extra length is supported on a cable arm or service loop. The above increases cost of the cables and weight of the cables, and further reduces a serviceability of the storage servers.

Additionally, traditional storage servers have a topology that limits the number of storage devices that can be combined to form a volume.

BRIEF DESCRIPTION OF THE DRAWINGS

The embodiments described herein will be understood more fully from the detailed description given below and from the accompanying drawings.

DETAILED DESCRIPTION

Figure 1:
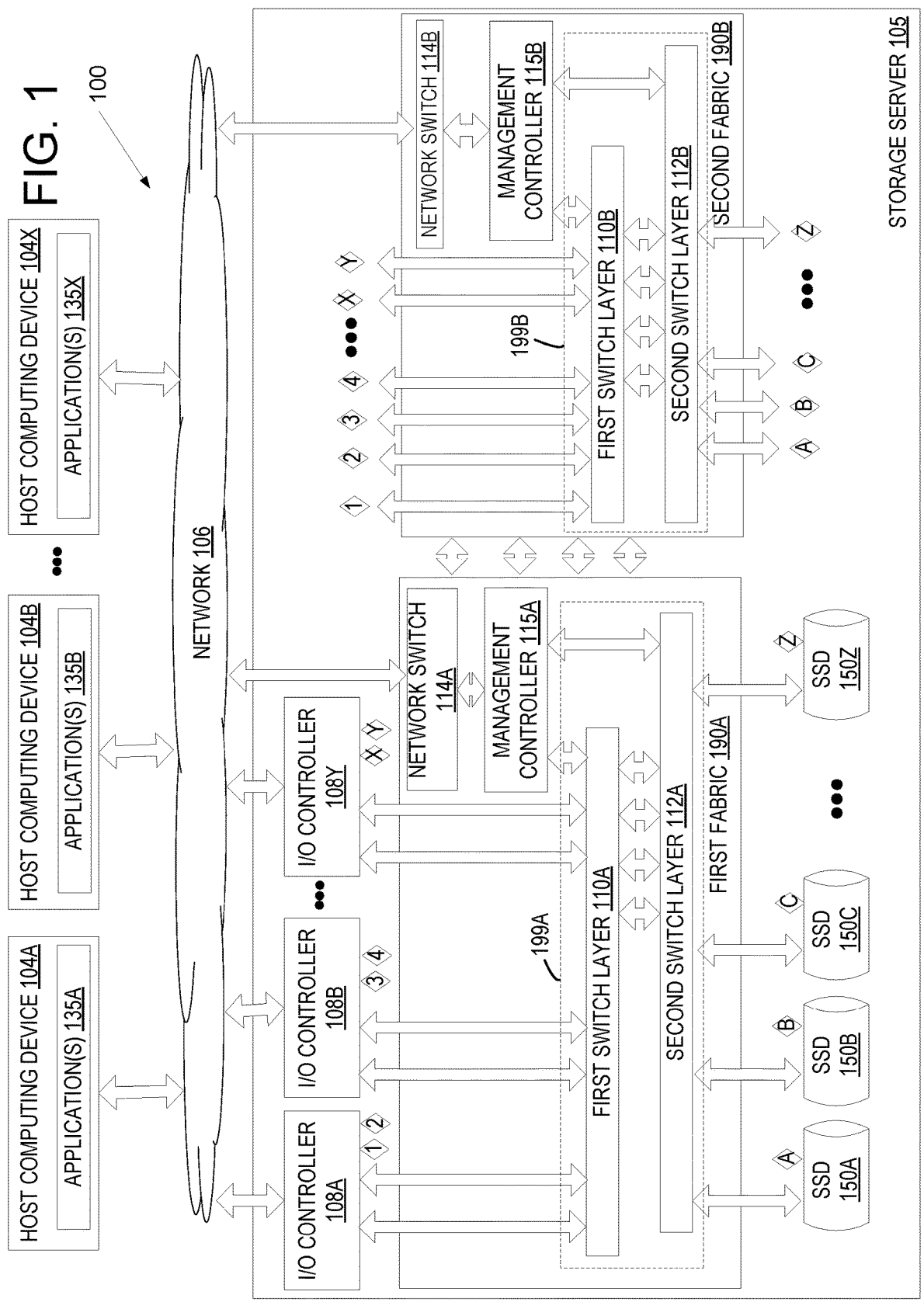
FIG. 1 is a block diagram of a network architecture that includes a storage server, in accordance with embodiments of the present disclosure.

Described herein are embodiments of a storage server that includes multiple different processing devices and/or nodes (e.g., IO controllers) that operate in parallel to manage data accesses to an array of solid state drives (SSDs). In embodiments, the storage server includes multiple fabrics, each configured to provide a fully connected mesh topology (e.g., fully connected mesh network or fabric) that connects each of the plurality of IO controllers to each of the plurality of SSDs in a manner that provides full bandwidth of the SSDs for each connection. In some embodiments, each fabric includes a first switch layer comprising a first plurality of switches coupled to the plurality of I/O controllers and a second switch layer comprising a second plurality of switches coupled to a) the first plurality of switches and b) the plurality of SSDs, wherein the first switch layer and the second switch layer together provide the fully connected mesh topology that connects every I/O controller of the plurality of I/O controllers to every SSD of the plurality of SSDs. The first and second fabrics may provide parallel paths between the IO controllers and the SSDs, where at any given moment some IO controllers may read from and write to one or more SSDs using the first fabric and some IO controllers may read from and write to the same or different SSDs using the second fabric. Accordingly, both fabrics may be active in parallel, with each fabric managing some portion of an IO load. Each fabric may also act as a backup fabric in case the other fabric fails.

The fully connected mesh topology provided by the storage server in embodiments provides advantages over conventional storage server architectures. One advantage of a fully connected mesh topology is that every IO controller can access every SSD. This enables the SSDs to be combined into a single zone or a few large zones that can be accessed by all IO controllers. In contrast, traditional storage servers that include multiple IO controllers divide storage devices into zones, where each IO controller has access to only one of the zones. By combining all of the SSDs into a single zone that is accessible to all IO controllers, the flexibility of the storage server is increased. For example, any controller can take over IO operations for any other IO controller that fails since they all have access to all storage. Additionally, the SSDs may be arranged as a redundant array of independent disks (RAID) array that includes very high ratio of data drives (e.g., drives containing customer data) to parity drives or metadata drives.

In an example, traditionally a storage server that can hold 48 storage devices might divide those storage devices into four groups of 12 storage devices each, where each group is arranged as a RAID array with two parity drives. Accordingly, in such an example a total of 40 drives would be used as data drives (e.g., drives containing client data) and 8 drives would be used as parity drives, providing a ratio of 5 data drives to 1 parity drive (5:1 or 20% parity drives). In contrast, embodiments described herein that include a fully connected mesh topology enable a large number of data drives to share the same parity drives. Thus, the SSDs could include 46 data drives and 2 parity drives, providing a ratio of 23 data drives to 1 parity drive (23:1 or 4% parity drives). If backups of the parity drives are used, the ratio drops to 2 data drives to 1 data drive (2:1 or 33% parity drives). Given the high ratio of data drives to parity drives, one or more sets of backup parity drives may be provided while still keeping a much higher ratio of data drives to parity drives than has heretofore been achieved for storage servers. Extending the above example, if 48 drives are included, with 2 parity drives that each have a backup parity drive, the ratio of data drives to parity drives would still be 11 data drives to 1 parity drive (11:1 or 9% parity drives) while providing a reduced risk of data loss than provided by a traditional storage server.

In embodiments, a storage server has an internal configuration that maximizes serviceability and minimizes down time while also optionally reducing a footprint required to accommodate the storage server in a data center. In one embodiment, the storage server includes a chassis configured to mount to a rack and a slidable tray coupled to the chassis, wherein the slidable tray is slidable along an axis of the chassis between an open position and a closed position. A plurality of solid state drives (SSDs) are mounted to the slidable tray, wherein the plurality of SSDs are vertically mounted into the slidable tray and are accessible while the slidable tray is in the open position. SSDs having varied form factors may be supported by the storage server. In embodiments, different slidable trays may be used, based on the drive form factor that is desired. In order to switch the drive form factor to be used, a slidable tray (e.g., that supports enterprise and data center SSD form factor (ED-SFF)) may be removed and replaced by another slidable tray that supports drives of a different form factor (e.g., next generation small form factor (NGSFF)).

The storage server additionally includes a mid-plane coupled to the chassis. An internal cable management support including a plurality of internal cables (e.g., such as an internal cable chain or an internal cable arm) connects the plurality of SSDs to the mid-plane. The internal cable management support and internal cables enable the slidable tray and the plurality of SSDs mounted thereto to be moved to the open position without moving the chassis relative to the rack. Use of an interconnect structure that uses internal high speed cables also allows flexibility as well as provides interface speed upgrades, since a cable mid-plane provides much lower signal loss than a similar printed circuit board (PCB)-based mid-plane. High speed cables provide much longer lasting technology for the high speed interconnects versus PCB mid-planes.

The storage server further includes a plurality of fabrics (e.g., two fabrics) coupled to the mid-plane, each fabric of the plurality of fabrics comprising a management controller and one or more switches. Additionally, the storage server includes a plurality of input/output (IO) controllers coupled to the mid-plane, wherein each of the plurality of IO controllers to read from and write to one or more of the plurality of SSDs.

The internal cable management support and cables within the chassis of the storage server may have enough slack or additional length to enable the slidable tray to slide from a closed position to an open position without moving the chassis relative to a rack to which it is mounted. Thus, the cables connecting external devices to the storage server do not need to be moved or extended to maintain the storage server or replace components such as IO controllers or SSDs of the storage server. The use of the mid-plane and the internal cable management support and associated cables to connect the IO controllers to the SSDs therefore enables a data center to use shorter cables to connect to the storage server, because those cables connecting to the storage server do not need to be long enough to accommodate sliding the storage server out of the rack. Moreover, the cables connecting to the storage server do not need to be supported by a cable arm. This can reduce a footprint of space that is needed to accommodate the storage server by up to about 10% as compared to traditional storage servers.

Furthermore, in embodiments the storage server is configured so that most or all components of the storage server can be replaced without impacting any other component of the storage server. For example, the storage server may include fan field replaceable units (FRUs), power supply units (PSUs), fabrics, SSDs, and IO controllers. Any of the fan FRUs, PSUs, fabrics, SSDs or IO controllers may be replaced while the storage server is in operation and/or without moving the chassis relative to a rack to which it is mounted and/or without affecting any other fan FRU, PSU, fabric, SSD, or IO controller. Thus, in embodiments serviceability of the storage server is much improved as compared to traditional storage servers.

The storage server set forth in embodiments herein provides improvements in reliability, serviceability, flexibility and system performance as compared to existing storage servers. In addition, the storage server in embodiments enables the mixing and matching of different computational modules, which may include IO controllers that include CPUs, IO controllers that include GPUs, IO controllers that include field programmable gate array (FPGA) accelerators, switch fabrics, network controllers and/or SSDs (with the same or different SSD form factors). Such mixing and matching may be performed in the same enclosure and with minimum or no changes to system design, while supporting a variety of internal interface speeds. In embodiments, a unique modular architecture coupled with the use of high-speed cables connected to mid-planes provides unmatched storage density, performance and flexibility. The system architecture described in embodiments herein is agnostic to silicon technologies used for individual modules.

In some embodiments, the storage server includes multiple slots each configured to receive an IO controller. In some embodiments, a single IO controller may occupy multiple slots. For example, the storage server may include eight slots, and one IO controller may occupy two or three of the eight slots. In this manner there is no limitation in terms of size or power consumption for IO controllers. If, for example, a certain size and power consumption is allocated to each slot, then an IO controller may be used that exceeds the size and power consumption associated with a single slot by using up multiple slots. This enables some IO controllers to be much more powerful than other IO controllers, and consume, for example, 2× or 3× of the power of other IO controllers that use a single slot. This provides a lot of flexibility and future system expansion capabilities and enables the system architecture to be used for a much longer period of time than traditional fixed servers with limited expansion capabilities.

In embodiments, a storage server has an internal system topology and module packaging where storage is internally mechanically isolated and connected to a mid-plane via high speed cables. Such isolation via internal cables allows storage and cooling subsystems to be located on an extendable tray and to be available for servicing from the front of the storage server without a need for removing the storage server from a rack. The proposed system packaging and interconnect topology allows access to any module in the system either from the front or from the back of the storage server without a need of rack rails or a cable management arm. In addition, such system topology allows for the modification of individual modules with no or little change to the rest of the system. The proposed system architecture may be referred to as a "rack in the box", where individual system components can be removed and/or serviced without any affect to the system functionality and without requiring any type of complicated service procedure or add-on service support infrastructure.

FIG. 1 is a block diagram of a network architecture 100 that includes a storage server 105, in accordance with embodiments of the present disclosure. The network architecture 100 may include one or more host computing devices (e.g., host computing devices 104A, 104B through 104X) connected to the storage server 105 via a network 106. Network 106 may be a wide area network (WAN) such as the Internet, a local area network (LAN), a storage area network (SAN) or a combination thereof. The host computing devices 104A-X and/or storage server 105 may connect to the network 106 via an Ethernet, Fibre Channel (FC), Fibre channel over Ethernet (FCoE), Infiniband®, serial attached small computer system interface (SAS) or serial ATA (SATA) protocol. Alternatively, other protocols may be used to connect to the network 106.

Host computing devices 104A-X may each include a physical machine and/or a virtual machine hosted by a physical machine. The physical machine may be a rackmount server, a desktop computer, or other computing device. In one embodiment, one or more host computing device 104A-X includes a virtual machine managed and provided by a cloud provider system. Each virtual machine offered by a cloud service provider may be hosted on a physical machine configured as part of a cloud. Such physical machines are often located in a data center. The cloud provider system and cloud may be provided as an infrastructure as a service (IaaS) layer. One example of such a cloud is Amazon's® Elastic Compute Cloud (EC2®).

Each host computing device 104A-X may host one or more applications 135A, 135B through 135X. The applications 135A-X may be application servers, web servers, standalone applications, and so forth. Accordingly, host computing devices 104A-X may provide services to clients via applications 135A-X in some embodiments.

Each host computing device 104A-X may additionally mount or otherwise connect to one or more volumes (e.g., one or more logical unit numbers (LUNs) and/or one or more virtual NVMe drives) associated with storage provided by storage server 105. Each volume may be a virtual drive that maps to one or more other virtual drives and/or to one or more physical drives. The term volume may be used to distinguish these virtual drives from lower level virtual drives. Each host computing device 104A-X may mount a different volume, or different host computing devices may mount or connect to one or more of the same volumes. Each volume is a logical storage device that may map a first logical storage address space that is presented to a host to a second logical storage address space of one or more underlying virtual drives and/or to physical storage address spaces of multiple storage devices. The underlying virtual drives may in turn map the second logical address space to physical storage address spaces of multiple storage devices (e.g., solid state drives (SSDs) 150A, 150B, 150C through 150Z of storage server 105) in embodiments.

Storage server 105 is a computing device that is configured and optimized to provide storage to client computing devices (e.g., to host computing devices 104A-X), which may be remote computing devices. Storage server 105 may be configured as a storage area network (SAN), network attached storage (NAS), or other remote storage type. Though a single storage server 105 is shown, the host computing devices 104A-X may connect to multiple storage servers. The multiple storage servers may be arranged in a cluster or other configuration.

Storage server 105 includes multiple IO controllers 108A, 108B through 108Y connected to multiple solid state drives (SSDs) 150A, 150B, 150C through 150Z via one or more fully connected mesh topology 199A, 199B. The fully connected mesh topology 199A-B connects every SSD 150A-Z to every IO controller 108A-Y. Moreover, each connection of an SSD 150A-Z to an IO controller 108A-Y has full bandwidth of the SSD.

The SSDs 150A-Z may be SAS/SATA drives, non-volatile memory express (NVMe) drives, Peripheral Component Interconnect (PCI) drives, Peripheral Component Interconnect Express (PCIe®) drives, small computer system interface (SCSI) over PCIe (SOP) drives, and/or solid state drives that communicate using different protocols. In one embodiment, the storage server 105 includes 8 IO controllers 108A-Y. However, other numbers of IO controllers 108A-Y may be used, such as 4, 10, 16, and so on. The number of SSDs included in storage server 105 may be less than 20 to more than 200. In one embodiment, the number of SSDs is 58 or 60. However, other numbers of SSDs may be used. In one embodiment, the SSDs are arranged in a RAID array having a single shared zone, where 48 of the SSDs contain data and 6 of the SSDs contain parity information. In one embodiment 4 of the SSDs are reserved for other purposes.

The solid state drives may have the same or different storage capacities. In some implementations, the number of host computing devices 104A-X, the number of IO controllers 108A-Y, and the number of SSDs 150A-Z may be different from each other.

Each IO controller 108A-Y is a device configured to connect one or more host computing devices 104A-X to one or more SSDs 150A-Z. In one embodiment, each IO controller 108A-Y includes one or more network interface controllers (NICs) such as Ethernet NICs and/or other protocol adapters (e.g., such as FC, SAS/SATA, or Infiniband (IB) adapters) that connect that IO controller to network 106. In one embodiment, each IO controller 108A-Y additionally includes a port that connects to fully connected mesh topologies 199A, 199B via one or more internal bus. In one embodiment, each IO controller 108A-Y includes a printed circuit board (PCB) with one or more components thereon, such as one or more processors, memories, switches, ports, and so on. Each IO controller 108A-Y may be an FRU that can be removed from the storage server 105 and replaced by another IO controller. In some embodiments, each of the IO controllers 108A-Y is the same (e.g., include the same processors, same memory, and so on). Alternatively, different IO controllers 108A-Y may be different. For example, different IO controllers 108A-Y may include a different number of processors, different memory capacities, different processor capabilities, and so on.

In one embodiment, storage server 105 includes multiple fabrics (e.g., two fabrics, also referred to as storage fabrics), and each IO controller 108A-Y is connected to each of the multiple fabrics. For example, a backplane of the storage server 105 may include a first storage fabric 190A and a second storage fabric 190B. The first and second storage fabrics 190A-B may make up a backplane of the storage server 105. In other embodiments, storage server 105 may include more than two fabrics, such as three or four fabrics.

The first and second fabrics 190A-B may be replaced (optionally during operation of the storage server 105) with different fabrics having the same or different configuration. For example, first fabric 190A may be replaced with a simpler fabric that does not include the multi-layer switch arrangement if fewer SSDs are to be used. Additionally, IO controllers 108A-Y may be removed and/or replaced with the same type of IO controllers or different types of IO controllers that might be more or less powerful, and that might be optimized for different workloads. For example, IO controller 108A may be replaced with an IO controller that includes one or more graphical processing units (GPUs) and/or FPGA accelerator.

Each storage fabric 190A-B includes hardware (e.g., switches, etc.) that connects IO controllers 108A-Y to SSDs 150A-Z. Each storage fabric 190A-B may include a fabric board (e.g., a printed circuit board (PCB) that includes multiple hardware components. Each storage fabric 190A-B enables any IO controller 408A-Y to connect to any SSD 150A-Z. Each storage fabric 190A-B may be independent of other storage fabrics, using its own hardware, ports, connections, etc. that are distinct from those used by the other storage fabrics. Accordingly, if any component in a storage fabric 190A-B fails and causes that storage fabric to fail, the IO controllers 108A-Y may continue to maintain connections to the SSDs 150A-Z via an alternative storage fabric. In one embodiment, each of the fabrics 190A-B is an FRU that can be removed from the storage server 105 and swapped out with a new replacement fabric.

In one embodiment, storage server 105 includes a first storage fabric 190A and a second storage fabric 190B, as shown. In alternative embodiments, storage server may include more than two storage fabrics. First storage fabric 190A and second storage fabric 190B manage the flow of data within storage server 105 by connecting specific IO controllers 108A-Y to specific SSDs 150A-Z on a message by message basis, allowing the storage fabrics 190A-B to regulate the flow of traffic. Each storage fabric 190A-B may include its own connectors, ports, hardware (e.g., switches), and so on that are separate and distinct from those of other storage fabrics. For example, first storage fabric 190A includes a first fully connected mesh topology 199A that includes a first switch layer 110A and a second switch layer 112A. Additionally, second storage fabric 190B includes a second fully connected mesh topology 199B that includes a second switch layer 110B and a second switch layer 112B. The first and second switch layers 110A, 112A and first and second switch layers 110B, 112B may each be connected in such a way as to provide the fully connected mesh topology. In one embodiment, the fully connected mesh topology is a fully connected serial computer expansion bus network, such as a fully connected peripheral component internet express (PCIe) network.

In embodiments, first switch layer 110A, 110B includes one or more switches connected to IO controllers 108A-Y, and second switch layer 112A, 112B includes one or more additional switches connected to the one or more switches of the first switch layer 110A, 110B and to the SSDs 150A-Z. Each of the switches in the first switch layer 110A-B and in the second switch layer 112A-B may be a multi-port bridge. Each of the switches in the first switch layer 110A-B and second switch layer 112A-B may be a same type of switch, such as a PCIe switch, an Ethernet switch, a SAS or SATA expander, a USB switch, or other type of switch, in embodiments. In one embodiment, each of the switches in the first and second switch layers 110A-B, 112A-B are PCIe switches.

In one embodiment, IO controllers 108A-Y include peripheral component interconnect express (PCIe) ports that connect to first switch layers 110A, 110B of the first and second fabrics 190A, 190B, respectively, via a PCIe link. Alternatively, or additionally, IO controllers 108A-Y may include small computer system interface (SCSI) ports, serial attached SCSI (SAS) ports, serial ATA (SATA) ports, Fibre Channel ports, or universal serial bus (USB) ports or other ports for connecting to the first switch layers 110A, 110B. IO controllers 108A-Y may additionally include a volatile and/or non-volatile memory to store firmware and/or software for performing operations described herein. Volatile memory may also be used for a data cache or buffer (e.g., as a write cache and/or a read look ahead cache). For example, IO controllers 108A-Y may include a main memory (e.g., read-only memory (ROM), flash memory, dynamic random access memory (DRAM) such as synchronous DRAM (SDRAM), etc.) and a static memory (e.g., flash memory, static random access memory (SRAM), etc.).

IO controllers 108A-Y may additionally include one or more processing device representing one or more general-purpose processors such as a microprocessor, central processing unit (CPU), graphical processing unit (GPU), FPGA accelerator, or the like. Additionally, IO controllers 108A-Y may each include a root complex (e.g., a PCI root complex) that acts as a local root complex for just the IO controller 108A-Y. The root complex may be integrated into the processing device or may be a separate component of the IO controller 108A-Y. In one embodiment, each IO controller 108A-Y is a system on a chip (SoC) including one or more processing device, one or more memory, one or more NICs, one or more internal ports and/or one or more discrete root complex.

Each IO controller 108A-Y is assigned to one or more host computing devices 104A-X, may include one or more of the volumes that are used by the host computing devices 104A-X, and handles input/output (IO) commands for those host computing devices. Each volume may be assigned to one or more host computing device 104A-X. In one embodiment, only one host computing device 104A-X is able to write to a volume at a time, but more than one host computing device 104A-X is able to read from the same volume 180A-M at a time.

Each IO controller 108A-Y may additionally include one or more virtual drives (not shown). A volume may be an aggregation of multiple virtual drives. For example, in one embodiment, each IO controller 108A-Y includes a separate virtual drive for each SSD 150A-Z accessed by the IO controller. Each volume may map to one or more virtual drives. Each virtual drive may map to one or more SSD 150A-Z. In other words, a virtual drive may be an aggregation of multiple SSDs 150A-Z.

Applications 135A-X running on a host computing device 104A-X may attempt to read data from and/or write data to a volume 180A-M that the host computing device 104A-X has access to (e.g., that has been presented to the host computing device 104A-X). Responsive to such a read or write request, the host computing device 104A-X sends a host command to the IO controller 108A-Y that is assigned to that host computing device 104A-X to initiate the read or write operation. As used herein, a host command is a read or write command that originates at a host computing device.

When the IO controller 108A-Y receives a read or write request from the host computing device 104A-X, the IO controller 108A-Y determines which virtual drives and/or which SSDs 150A-Z to read data from or write data to. The IO controller 108A-Y may then generate one or more sub-commands directed to the determined SSDs 150A-Z to write data to those SSDs or read data from those SSDs 150A-Z. The IO controller 108A-Y may then receive write acknowledgements or read data from the SSDs and then provide a write acknowledgement or the read data to the host computing device 104A-X.

Each solid state drive (SSD) 150A-Z (also referred to as a solid state storage device) is a non-volatile storage device that uses integrated circuits to persistently store data. SSDs 150A-Z have numerous advantages over traditional disk drives. As compared to disk drives, SSDs are more resilient, consume less power, and have lower latency (access times). Additionally, SSDs are able to perform many more IOPS than disk drives. For example, an SSD may perform millions of IOPS compared to hundreds or thousands of IOPS that may be performed by a disk drive. In one embodiment, SSDs 150A-Z are NAND-based Flash memory devices or NOR-based Flash memory devices. Flash memory devices are non-volatile and can be electronically erased and reprogrammed. Alternatively, one or more SSDs 150A-Z may be volatile memory-based solid state drives (e.g., dynamic random access memory (DRAM)-based SSDs) that have a battery backup. SSDs 150A-Z may include one or more ports (e.g., PCIe ports) to connect to switch 110. SSDs 150A-Z may connect to switch 110 via PCIe, SCSI, SAS, USB, or other connection protocols.

Each SSD 150A-Z has a controller and a storage area that includes memory (e.g., NAND Flash non-volatile memory) to store data. The storage area is divided into pages, which is the smallest unit of storage to which data may be stored. SSD pages may have sizes based on a configuration of an SSD. For example, SSDs 150A-Z may have pages that are 4 kilobytes (kB), 8 kB, or 26 kB. However, other page sizes are also possible. SSD pages are grouped into blocks. Each block contains a particular number of pages, which is again dependent on a design of a particular SSD. Typical SSDs have blocks that include 256 pages.

In one embodiment, each fabric 190A, 190B includes a management controller 115A, 115B. In embodiments, the management controllers 115A-B are soldered to the respective fabrics 190A-B, and are not removable therefrom. Alternatively, management controllers 115A-B may be removable from fabrics 190A-B and swapped with different management controllers. In one embodiment, each management controller 115A-B includes a dedicated PCB that can be connected to and removed from first and second fabrics 190A-B. Management controller 115A-B may be a device configured to perform particular operations with regards to management of the array of SSDs 150A-Z and/or with regards to a particular fabric 190A-B. Management controller 115A-B may include one or more processing device, one or more port for connecting to switches in first switch layer 110A-B and switches in second switch layer 112A-B, and/or a port for connecting to a network switch 114A-B or NIC of the first fabric 190A or second fabric 190B, respectively. Management controller 115A-B may additionally include a volatile and/or non-volatile memory to store firmware and/or software for performing operations described herein. Additionally, management controller 115A-B may include a root complex (e.g., a PCI root complex) that acts as a root complex for the storage server 105. The root complex may be integrated into the processing device of the management controller 115A-B or may be a separate component of the management controller 115. In one embodiment, the management controller 115A-B is a system on a chip (SoC) including a processing device, a memory, one or more NICs, one or more internal ports and/or a discrete root complex.

The management controller 115A-B determines how to configure the array of SSDs 150A-Z and further determines configurations for the one or more volumes and/or virtual drives. For example, management controller 115A-B may determine which volumes map to which virtual drives, which virtual drives map to which SSDs 150A-Z, and which portions of those SSDs the virtual drives map to. Once these configurations are determined, management controller 115A-B may send these configurations to the IO controllers 108A-Y for implementation. Management controller 115A-B additionally performs discovery operations and may be responsible for pairing volumes on IO controllers 108A-Y with host computing devices 104A-X.

In order for volumes to be generated, SSDs to be allocated to IO controllers 108A-Y and virtual drives, virtual drives to be allocated to volumes, and data paths to be set up between host computing devices 104A-X and IO controllers 108A-Y and between IO controllers 108A-Y and SSDs 150A-Z, the storage server 105 may perform a set of initiation operations. These initiation operations include discovery operations and configuration operations. The initiation operations (e.g., discovery operations and configuration operations) may be initiated when storage server 105 powers on.

Each of the IO controllers 108A-Y may perform discovery and configuration operations within a domain of that IO controller 108A-Y. Each IO controller 108A-Y may include a local root complex that may act as a memory manager for that IO controller 108A-Y. The IO controller 108A-Y may identify a port (e.g., a PCIe port) of the IO controller 108A-Y and assign a memory address range of the IO controller's memory for the port and record an entry that maps the port to the memory address range in a memory map. In one embodiment, each IO controller has its own memory map, referred to herein as a local memory map. The local memory map of an IO controller may include the address ranges that can be used to access different devices in the domain of the IO controller.

The memory address range represents an address range that will act as a buffer for reads and writes and as a window to access the IO controller. Accordingly, to satisfy read and write commands from host computing devices 104A-X, data may be temporarily written into the memory address range. The full memory address range may be addressable by SSDs 150A-Z, other IO controllers 108A-Y and/or the management controller 115A-B through the port. In one embodiment, the memory address range has a size of 128 Megabytes (MB). Alternatively, other sized memory address ranges may be used. For example, memory address ranges allocated to ports may have a size of 64 MB, 256 MB, 512 MB, and so on.

Management controller 115A-B may perform discovery and configuration operations within a domain of the management controller 115A-B. In one embodiment, the management controller 115A-B includes or operates in conjunction with a root complex for the management controller 115A-B. The root complex may act as a memory manager for the entire storage server 105. Each of the IO controllers 108A-Y, the first switch layer 110A, second switch layer 112A and the SSDs 150A-Z are in the domain of the management controller 115A. Similarly, each of the IO controllers 108A-Y, the first switch layer 110B, second switch layer 112B and the SSDs 150A-Z are in the domain of the management controller 115B.

Management controller 115A performs discovery operations to identify the switches in first switch layer 110A, the switches in second switch layer 112A, each of the SSDs 150A-Z and each of the IO controllers 108A-Y. The management controller 115A may discover each device in the storage server 105 included in or attached to first fabric 190A, and identify that device as a switch port or an endpoint port. Each port of the switches in the switch layers 110A, 112A is identified as a switch port. Each IO controller 108A-Y and SSD 150A-Z is identified as an endpoint port. The management controller 115A is identified as a root port. In one embodiment, the IO controllers 108A-Y and SSDs 150A-Z are set up as endpoints (and thus peers) within the storage server 105.

Management controller 115B performs discovery operations to identify the switches in first switch layer 110B, the switches in second switch layer 112B, each of the SSDs 150A-Z and each of the IO controllers 108A-Y. The management controller 115B may discover each device in the storage server 105 included in or attached to second fabric 190B, and identify that device as a switch port or an endpoint port. Each port of the switches in the switch layers 110B, 112B is identified as a switch port. Each IO controller 108A-Y and SSD 150A-Z may be identified as an endpoint port. The management controller 115B is identified as a root port.

When a device is discovered by a management controller 115A-B, the management controller 115A-B may determine an amount of memory to assign to that device and assign a memory address range of the management controller's memory to that device. The memory address range allocated to a device represents memory addresses of the management controller's 115A-B memory that can be used to access that device. Management controller 115A-B may generate a memory map (referred to herein as a global memory map) that contains entries for each of the SSDs 150A-Z, each of the switches in the first switch layer 110A-110B, each of the switches in the second switch layer 112A-112B, each of the IO controllers 108A-Y and the management controller 115A-B. The memory map holds the memory addresses that have been assigned to all devices in the storage server and that can be used to access those devices in the domain of the management controller 115A-B.

Assigning a memory address range to a device may include adding an entry to a memory map of the management controller 115A-B that includes the device and the memory address range, and may additionally include notifying the device of the memory address range that has been assigned to it. An entry in the memory map may include a bus identifier (ID) for a link or bus that the device is attached to, a device identifier (ID) for the device, and a function identifier (ID) for a function of the device. Note that for PCIe a link and not a bus is technically used. However, standard terminology for the link is a "bus". The device ID may identify a specific device under a link or bus topologically and/or may be assigned to the device. There may be multiple devices under a link or bus. The function ID may identify a function of a device (e.g., an SSD function, a switch function, an IO controller function, and so on). Devices may have one or more functions.

Management controller 115A-B may query some devices (e.g., SSDs 150A-Z) to determine an amount of memory to assign to that device. The queried devices may request a specific amount of memory. For example, an SSD 150A-Z may request an amount of memory that is needed to address all of the submission queues, completion queues and other control structures of the SSD. In examples, some SSDs may request 16 kilobytes (kB) of memory, some SSDs may request 8 kB of memory, some SSDs may request 32 kB of memory, and/or other SSDs may request other amounts of memory.

Management controller 115A-B may also automatically determine an amount of memory to assign to a device based on the device type for that device (e.g., the function of the device). For example, management controller 115A-B may automatically determine a size of a memory address range to assign to a device after identifying the device as an IO controller 108A-Y. In one embodiment, each IO controller 108A-Y is assigned the same amount of memory of the management controller 115A-B. For example, a port for each IO controller 108A-Y may be assigned a memory address range of the management controller 115 having a size of 128 MB in one embodiment. Alternatively, different IO controllers 108A-Y may be assigned different amounts of memory of the management controller 115A-B.

Management controllers 115A-B may also perform other operations to configure a device. For example, management controllers 115A-B may determine a number of queue pairs in each SSD 150A-Z, divide the queue pairs into queue pair subsets, and allocate the submission queue subsets to IO controllers 108A-Y.

Note that for simplification of FIG. 1, network switches 114A, 114B are shown as connected to network 106. However, network switches may additionally or alternatively connect management controller 115A, 115B to each of IO controllers 108A-Y (such connections are not illustrated). In one embodiment, network switches 114A-B are Ethernet switches.

During initiation, or once initiation is complete, one or both management controllers 115A-B may determine which storage fabric 190A-B to make active for each of the IO controllers 108A-Y and for each of the SSDs 150A-Z. A management controller 115A-B may then send a message to one or more SSD 150A-Z and/or to one or more IO controller 108A-Y indicating which of the storage fabrics to connect to. At any time a management controller 115A-B may determine to make a different storage fabric active for an SSD and/or IO controller, and may send a new message notifying the SSD and/or IO controller to switch to that storage fabric. In embodiments, first fabric 190A and second fabric 190B are active in parallel, with first storage fabric 190A acting as a primary fabric for a first subset of IO controllers 108A-Y and as a secondary or backup fabric for a second subset of IO controllers 108A-Y, and with second storage fabric 190B acting as a primary fabric for the second subset of IO controllers 108A-Y and as a secondary or backup fabric for the first subset of IO controllers 108A-Y.

After initiation is completed, the SSDs 150A-Z and IO controllers 108A-Y may be divided into subsets. A first subset of SSDs 150A-Z and/or a first subset of IO controllers 108A-Y may be actively connected to the first storage fabric 190A. This may include using multiplexers attached to the SSDs in the first subset of SSDs to switch those SSDs over to the first storage fabric 190A. Similarly, a second subset of SSDs 150A-Z and/or a second subset of IO controllers 108A-Y may be actively connected to the second storage fabric 190B. This may include using multiplexers attached to the SSDs in the second subset of SSDs to switch those SSDs over to the second storage fabric 190B. In one embodiment, half of the SSDs and IO controllers are routed to each of the storage fabrics. If a storage fabric fails, the IO controllers and SSDs routed to that storage fabric may be rerouted to the other storage fabric.

Each IO controller 108A-Y is capable of connecting to one or more hosts (also referred to as clients), and can read data from the SSDs and write data to the SSDs on behalf of those hosts. Each IO controller 108A-Y may include a local memory map with memory address ranges allocated to multiple ports of the IO controller. Each management controller 115A-B may additionally include a global memory map with memory address ranges allocated to the multiple ports of the IO controllers 108A-Y. An IO controller 108A-Y may reference data and commands using memory addresses in its own domain. However, outside of the IO controller 108A-Y, one or more switch, a management controller and SSDs on a particular fabric may all reference data and commands using memory addresses in the domain of the management controller 115A-B. Accordingly, in one embodiment each IO controller 108A-Y is connected to or includes a translator module that is configured to translate messages and commands between the domain (address space) of an IO controller 108A-Y and the domain (address space) of a management controller 115A-B. A translator may be a discrete device (e.g., an integrated circuit or chip), may be a component of another device (e.g., a component of a port), or may be a logical module that executes on a processing device. The translator may include a translation table, file or other translation data structure that maps memory addresses of the IO controller's memory to memory addresses of the first management controller's 115A memory and to memory addresses of the second management controller's 115B memory.

In an example, when an IO controller 108A-Y receives a message from a port of the IO controller 108A-Y that is directed to a first memory address of the IO controller 108A-Y that has been allocated to SSD 150A, translator may translate that first memory address to a first memory address of a management controller 115A-B. In another example, when translator receives a message from a of IO controller 108A that is directed to a second memory address of the IO controller 108A that has been allocated to SSD 150A, translator may translate that second memory address of the IO controller to a second memory address of the management controller 115A-B. In another example, when translator receives a message from SSD 150A that is directed to a first memory address of the management controller 115A-B, translator may translate the first memory address of the management controller 115A-B to a first memory address of the IO controller that has been allocated to a particular port of the IO controller 108A. Accordingly, translators may bridge the domains between the IO controllers 108A-Y and the management controllers 115A-B.

Figure 2:
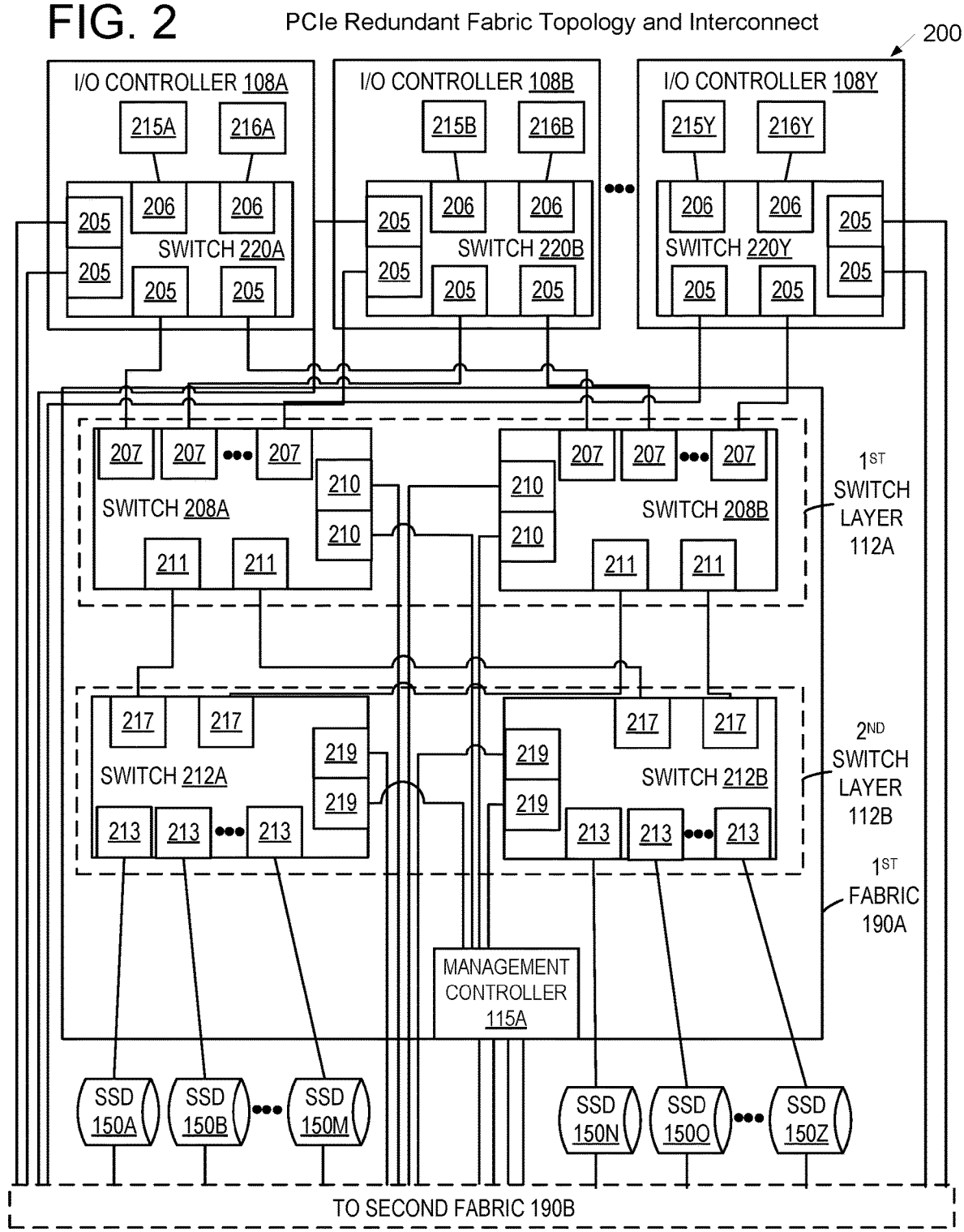
FIG. 2 is a block diagram of an interconnect topology of a storage server having a fully connected mesh topology that connects IO controllers and storage devices, in accordance with embodiments of the present disclosure.

FIG. 2 is a block diagram of an interconnect topology 200 of a storage server having a fully connected mesh topology that connects IO controllers and storage devices, in accordance with embodiments of the present disclosure. In one embodiment, the interconnect topology 200 is for the storage server 105 of FIG. 1. In one embodiment, the interconnect topology 200 is a PCIe interconnect topology, that includes redundant fabrics.

The storage server having interconnect topology 200 includes IO controllers 108A-Y, first fabric 190A, second fabric 190B and SSDs 150A-Z. As shown, one or more of the IO controllers 108A-Y may include multiple processors 215A-Y, 216A-Y. Each of the processors 215A-Y, 216A-Y may act as a node and/or controller that is responsible for providing read and write services for a particular client and/or for reading from and writing to one or more particular volumes of storage associated with a particular client. Accordingly, one or more IO controller 108A-Y may include multiple nodes, where each node of an IO controller can independently perform the functions described above with regards to IO controllers. In embodiments in which an IO controller includes multiple nodes and/or processors, the IO controller includes a switch 220A-Y to connect the multiple processors/nodes to the first fabric 109A and second fabric 190B. In one embodiment, one or more IO controllers 108A-Y includes multiple processors that together serve a particular client and/or perform read and write operations on one or more particular volumes associated with a particular client. In one embodiment, one or more IO controllers 108A-Y include multiple processors, where one processor may be an active or primary processor, and one or more other processor may be a secondary or backup processor that may take over if the primary processor fails.

In some embodiments, one or more IO controller 108A-Y includes a single node and/or a single processor. IO controllers 108A-Y having a single processor/node may not include a switch 220A-Y.

Switches 220A-Y may be, for example, PCIe switches or any of the other types of switches discussed herein. Each of the switches 220A-Y may include multiple ports 205, 206. Ports 206 may be upstream ports, and may connect switches 220A-Y to processors 215A-Y, 216A-Y using a first number of lanes. In one embodiment, the first number of lanes used to connect switch 220A-Y to processor 215A-Y is 16 lanes, and the first number of lanes used to connect switch 220A-Y to processor 216A-Y is 16 lanes. In one embodiment, ports 205 are non-transparent bridges that connect switches 220A-Y to first fabric 190A and second fabric 190B. Ports 205 may connect switches 208A-B to IO controllers 108A-Y using a second number of lanes. In one embodiment, each of ports 205 connects a switch 208A-B to an IO controller 108A-Y using 8 lanes. In one embodiment, switches 220A-Y are 64 lane switches or 68 lane switches. Alternatively, switches 220A-Y may have different numbers of lanes.

First fabric 190A and second fabric 190B may have a same architecture. Some components of the internal architecture of first fabric 190A are shown, and the internal architecture of second fabric 190b is not shown, for simplification. As shown, first fabric 190A includes first switch layer 112A and second switch layer 112B.

In one embodiment, first switch layer 112A includes switch 208A and switch 208B, and second switch layer 112B includes first switch 212A and second switch 212B. First and second switch 208A-B each include multiple ports 207, 210, 211. In one embodiment, ports 207 are non-transparent bridges connecting switch 208A-B to switches 220A-Y of IO controllers 108A-Y. In one embodiment, each port 207 connects switch 208A-B to IO controllers 108A-Y using the second number of lanes (e.g., 8 lanes). In one embodiment, ports 210 are up stream ports connecting switches 208A-B to management controller 115A and to management controller 115B of second fabric 190B. In one embodiment, ports 210 provide 2 lane connections to the management controllers 115A-B.

Each of first switch 208A and second switch 208B may connect to first switch 212A and second switch 212B. Ports 211 of switches 208A-B may be non-transparent bridges. Each port 211 may provide a third number of lanes of connection to one of switches 212A-B. In one embodiment, each port 211 provides a 16 lane connection. In one embodiment, switches 208A-B are 96 lane switches or 100 lane switches. Alternatively, switches 208A-B may have other numbers of lanes.

First and second switch 212A-B each include multiple ports 217, 219, 213. In one embodiment, ports 217 are non-transparent bridges connecting switches 212A-B to switches 108A-B. In one embodiment, each port 217 connects switch 212A-B to switch 208A or switch 208B using the third number of lanes (e.g., 16 lanes). In one embodiment, ports 219 are up stream ports connecting switches 212A-B to management controller 115A and to management controller 115B of second fabric 190B. In one embodiment, ports 219 provide 2 lane connections to the management controllers 115A-B.

First switch 212A may connect to a first subset of SSDs 150A-M, and second switch 212B may connect to a second subset of SSDs 150N-Z. Ports 213 of switches 212A-B may be downstream ports and/or non-transparent bridges. Each port 213 may provide a fourth number of lanes of connection to a particular SSD 150A-Z. In one embodiment, each port 213 provides a 2 lane connection. In one embodiment, switches 212A-B are 96 lane switches. Alternatively, switches 212A-B may have other numbers of lanes.

The interconnect topology 200 illustrated in FIG. 2 provides a fully connected mesh topology connecting each IO controller 108A-Y (and each processor 215A-Y, 216A-Y of reach IO controller 108A-Y) to each SSD 150A-Z. Accordingly, every IO controller 108A-Y has access to every SSD 150A-Z. This enables, for example, IO controller 108A to write to SSD 150A and any of IO controllers 108B-Y to simultaneously or in parallel read from and/or write to SSD 150A. For example, IO controller 108A may write to a location on SSD 150A and at the same time IO controller 108B may read from the same location on SSD 150A. In another example, IO controller 108A may write to a first location on SSD 150A and in parallel IO controller 108B may write to a second location on SSD 150A. The fully connected mesh topology 199A-B reduces or eliminates restrictions on how volumes can be created across the SSDs 150A-Z. For example, the SSDs are not limited to different zones, where a volume cannot span two zones. Instead, a single shared zone may be generated that includes all of the SSDs that are to be used for client data and/or parity information.

Accordingly, in one embodiment a storage server 105 includes a plurality of solid state drives (SSDs) 150A-Z and a plurality of input/output (IO) controllers 108A-Y, wherein each of the plurality of IO controllers is configured to read from and write to one or more of the plurality of SSDs. The storage server 105 further includes a plurality of fabrics 190A-B, each fabric of the plurality of fabrics configured to provide a fully connected mesh topology that connects each of the plurality of IO controllers 108A-Y to each of the plurality of SSDs 150A-Z. Each fabric of the plurality of fabrics comprise a management controller 115A-B, a first switch layer 112A comprising a first plurality of switches (e.g., switches 108A-B) coupled to the plurality of IO controllers 108A-Y and a second switch layer 112B comprising a second plurality of switches (e.g., switches 212A-B) coupled to a) the first plurality of switches (e.g., switches 208A-B) and b) the plurality of SSDs 150A-Z. The first switch layer and the second switch layer together provide the fully connected mesh topology that connects every IO controller of the plurality of IO controllers to every SSD of the plurality of SSDs.

In one embodiment, the first switch layer comprises a first switch having a first plurality of connections to the plurality of IO controllers, each connection of the first plurality of connections having a first number of lanes. The first switch layer further comprises a second switch having a second plurality of connections to the plurality of IO controllers, each connection of the second plurality of connections having the first number of lanes. In one embodiment, the second switch layer comprises a third switch having a third connection to the first switch, the third connection having a second number of lanes that is greater than the first number of lanes, a fourth connection to the second switch, the fourth connection having the second number of lanes, and a fifth plurality of connections to a first subset of the plurality of SSDs, each connection of the fifth plurality of connections having a third number of lanes that is less than the first number of lanes. In one embodiment, the second switch layer further comprises a fourth switch having a sixth connection to the first switch, the sixth connection having the second number of lanes, a seventh connection to the second switch, the seventh connection having the second number of lanes, and an eighth plurality of connections to a second subset of the plurality of SSDs, each connection of the eighth plurality of connections having the third number of lanes.

In one embodiment, the first switch comprises a respective non-transparent bridge for each connection of the first plurality of connections, the third connection and the sixth connection, the second switch comprises a respective non-transparent bridge for each connection of the second plurality of connections, the fourth connection and the seventh connection, the third switch comprises a respective non-transparent bridge for each connection of the third connection and the fourth connection, and the fourth switch comprises a respective non-transparent bridge for each connection of the sixth connection and the seventh connection.

In one embodiment, the first switch further comprises a ninth connection to a first management controller of the first fabric and a tenth connection to a second management controller of the second fabric, the ninth connection and the tenth connection having the third number of lanes or a fourth number of lanes. The second switch further comprises an eleventh connection to the first management controller of the first fabric and a twelfth connection to the second management controller of the second fabric, the eleventh connection and the twelfth connection having the third number of lanes or the fourth number of lanes. The third switch further comprises a thirteenth connection to the first management controller of the first fabric and a fourteenth connection to the second management controller of the second fabric, the thirteenth connection and the fourteenth connection having the third number of lanes or the fourth number of lanes. The fourth switch further comprises a fifteenth connection to the first management controller of the first fabric and a sixteenth connection to the second management controller of the second fabric, the fifteenth connection and the sixteenth connection having the third number of lanes or the fourth number of lanes. In one embodiment, the first number of lanes is 8 lanes, the second number of lanes is 16 lanes and the third number of lanes is 2 lanes.

In one embodiment, the plurality of SSDs comprise at least 50 SSDs arranged as a redundant array of independent disks (RAID) array, wherein two or more SSDs of the at least 50 SSDs are parity drives that provide parity information for a remainder of the at least 50 SSDs. In one embodiment, the plurality of SSDs are arranged as a redundant array of independent disks (RAID) array having a shared zone, wherein two or more SSDs of the plurality of SSDs are configured to provide parity information for the shared zone. The two or more SSDs may comprise a first pair of SSDs, a first SSD of the first pair of SSDs comprising first parity information and a second SSD of the first pair of SSDs comprising second parity information. The two or more SSDs may further comprise a second pair of SSDs, a first SSD of the second pair of SSDs comprising a first copy of the first parity information and a second SSD of the second pair of SSDs comprising a first copy of the second parity information. The second pair of SSDs may provide duplicates or backup copies of the parity information stored in the first pair of SSDs. In one embodiment, the two or more SSDs further comprise a third pair of SSDs, a first SSD of the third pair of SSDs comprising a second copy of the first parity information and a second SSD of the third pair of SSDs comprising a second copy of the second parity information. The third pair of SSDs may provide further duplicates or backup copies of the parity information stored in the first pair of SSDs.

In one embodiment, the plurality of SSDs 120A-Z are arranged as a redundant array of independent disks (RAID) array, wherein a ratio of total capacity to storage space dedicated to storage of parity information for the RAID array is about 9:1 or better. Examples of possible ratios that may be achieved are 30:1, 15:1, 10:1, 9:1, 8:1, and so on. The ratio of useful storage to wasted space (i.e., space dedicated for parity information) may be much higher than what is achievable using traditional storage servers increasing an amount of storage that is available for clients. For example, ratios of useful storage space to space dedicated for parity information or metadata information that are achievable in embodiments are 29:1, 14:1, 9:1, 8.3:1, 8:1, and so on. The increased ratio of useful storage space to storage space dedicated to parity information reduces the cost per Gigabyte of the storage.

In one embodiment, each IO controller 108A-Y of the plurality of IO controllers is configured to access each SSD 150A-Z of the plurality of SSDs in parallel with one or more other IO controllers of the plurality of IO controllers accessing the plurality of SSDs, wherein each fabric 190A-B of the plurality of fabrics is configured to remain active in parallel to each other fabric of the plurality of fabrics.

In the illustrated embodiment, the fully connected mesh topology is realized using first switch layer that includes a pair of switches and a second switch layer that includes a pair of switches. In one embodiment, each switch in the first switch layer has 100 lanes and each switch in the second layer has 96 lanes. In other embodiments, other arrangements may be used for the first switch layer and the second switch layer. For example, the first switch layer may include a single switch and the second switch layer may include four switches. In one embodiment, the first switch layer includes a first switch having 100 lanes or 96 lanes. In one embodiment, the first switch includes 8 lane connections to each of the IO controllers 108A-Y and 8 lane connections to each switch in the second switch layer, and each switch in the second switch layer includes 2 lane connections to a subset of SSDs 150A-Z. In another example, the first switch layer may include four switches and the second switch layer may include four switches.

In one embodiment, the first plurality of switches and the second plurality of switches each comprise serial computer expansion bus switches (e.g., PCIe switches). In one embodiment, each fabric 190A-B further includes one or more network switch that connects each IO controller 108A-Y of the plurality of IO controllers to the management controller 115A-B of the fabric 190A-B.

Figure 3:
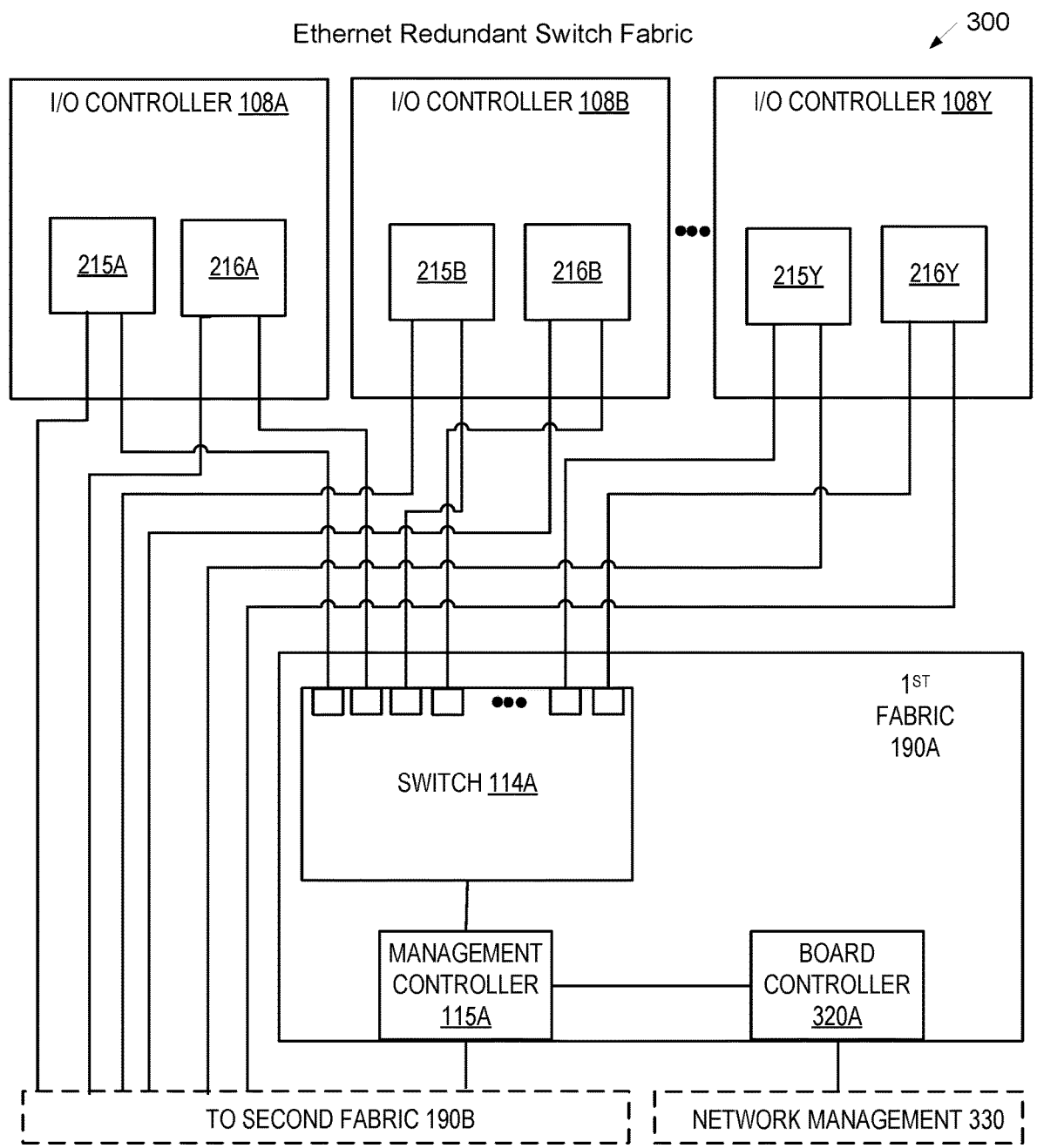
FIG. 3 is a block diagram of an Ethernet redundant switch fabric that connects IO controllers to management controllers of fabrics of a storage server, in accordance with embodiments of the present disclosure.

FIG. 3 is a block diagram of an Ethernet redundant switch fabric 300 for storage server 105 of FIG. 1 that connects IO controllers 108A-Y to management controllers 115A-B of fabrics of storage server 105, in accordance with embodiments of the present disclosure. As shown, each IO controller 108A-Y may include multiple processors/nodes 215A-Y, 216A-Y. Alternatively, one or more IO controller 108A-Y may include only a single processor. Each processor 215A-Y, 216A-Y connects to a switch 114A of first fabric 190A and to a switch 114B of second fabric 190B. The switches 114A-B may each be network switches, such as Ethernet switches. In one embodiment, switches 114A-B are 25 GHz or 10 GHz switches. Switches 114A-B connect to respective management controllers 115A-B. Accordingly, switches 114A-B enable management controllers 115A-B to communicate with the processors 215A-Y, 216A-Y of each of IO controllers 108A-Y.

Management controller 115A may further connect to management controller 115B via a network connection (e.g., via an Ethernet connection). Additionally, management controllers 115A-B may each connect to a respective board controller (e.g., board controller 320A) via a network connection such as an Ethernet connection. Board controllers (e.g., board controller 320A) may then connect to network management 330 via network connections such as Ethernet connections.

Board controller 320A may comprise a microcontroller responsible for monitoring and/or controlling board power, temperature, health of components on fabric 190A, and so on. Board controller 320A may remain powered even when power to fabric 190A is shut off.

Figure 4A:
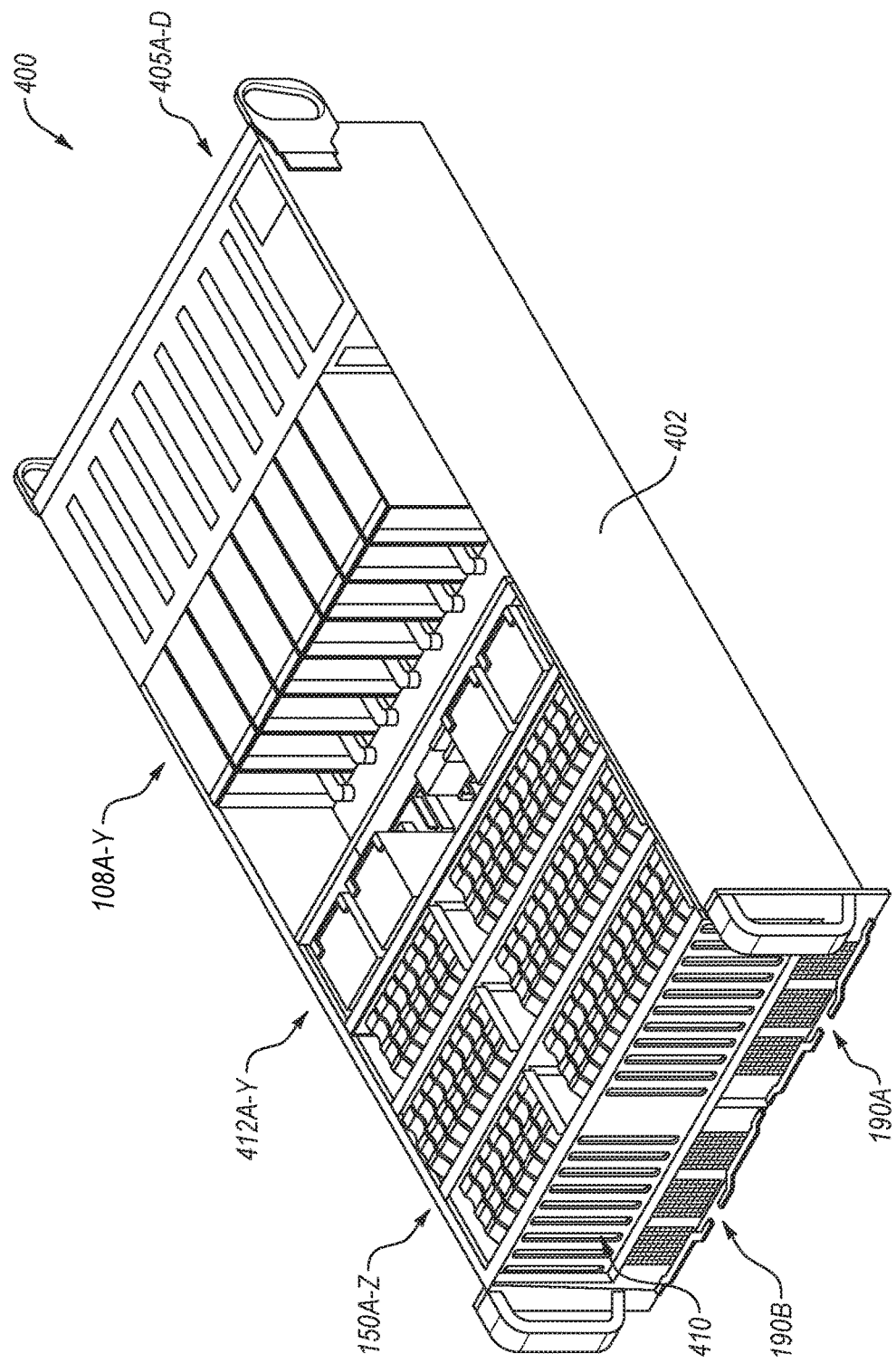
FIG. 4A illustrates an isometric view of a storage server with a closed drive tray, in accordance with embodiments of the present disclosure.
Figure 4B:
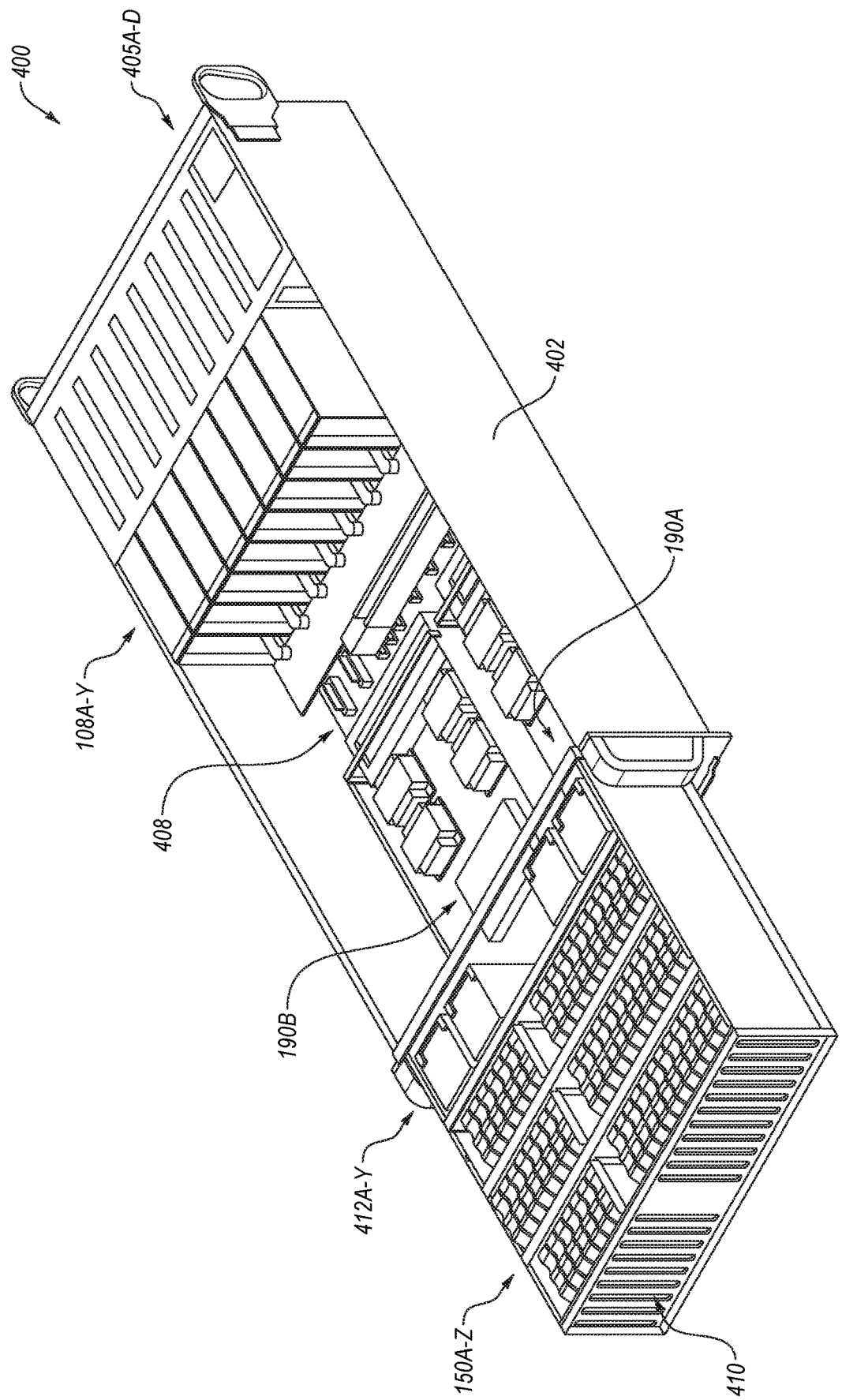
FIG. 4B illustrates an isometric view of a storage server with an open drive tray, in accordance with embodiments of the present disclosure.
Figure 4C:
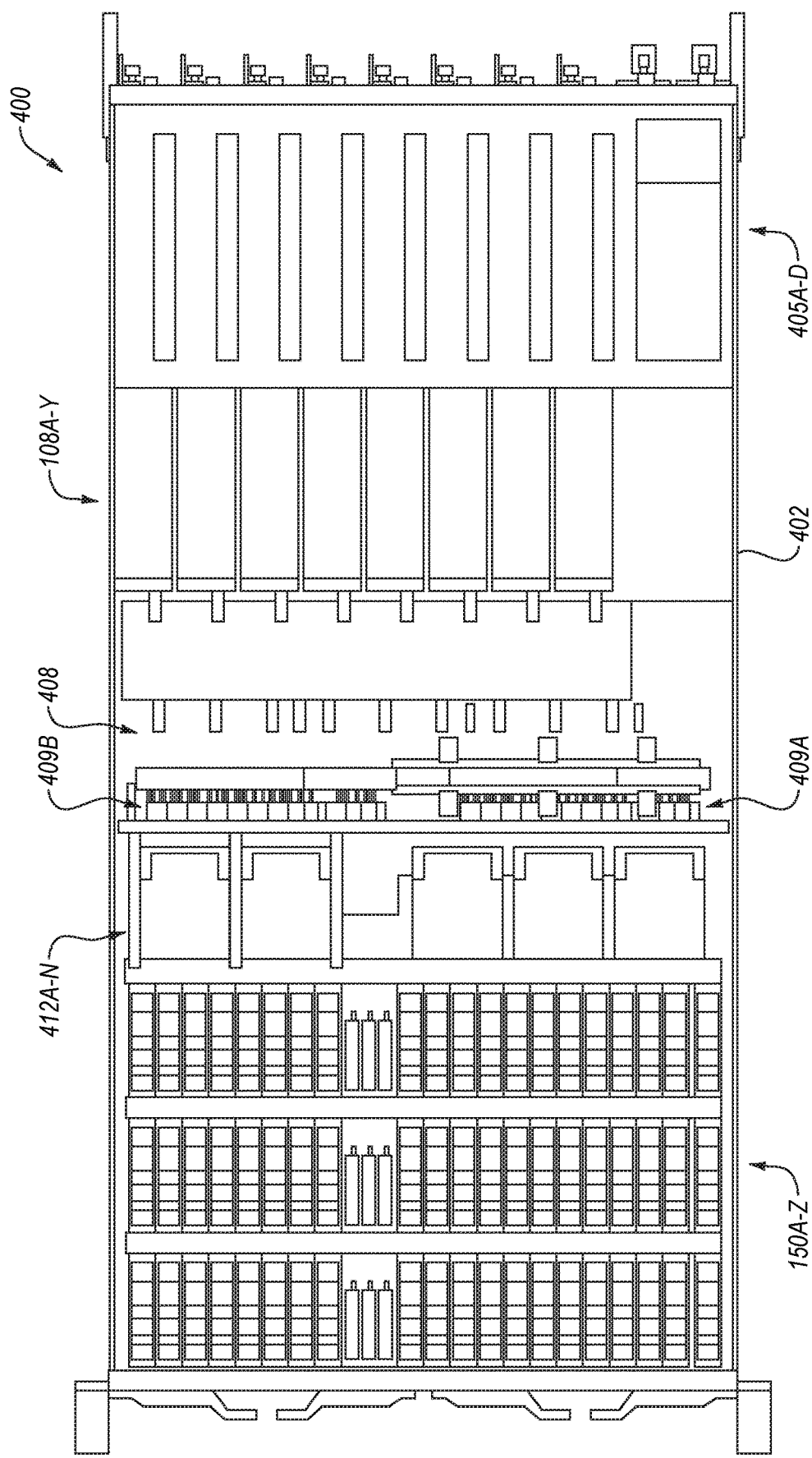
FIG. 4C illustrates a top view of a storage server with a closed drive tray, in accordance with embodiments of the present disclosure.
Figure 4D:
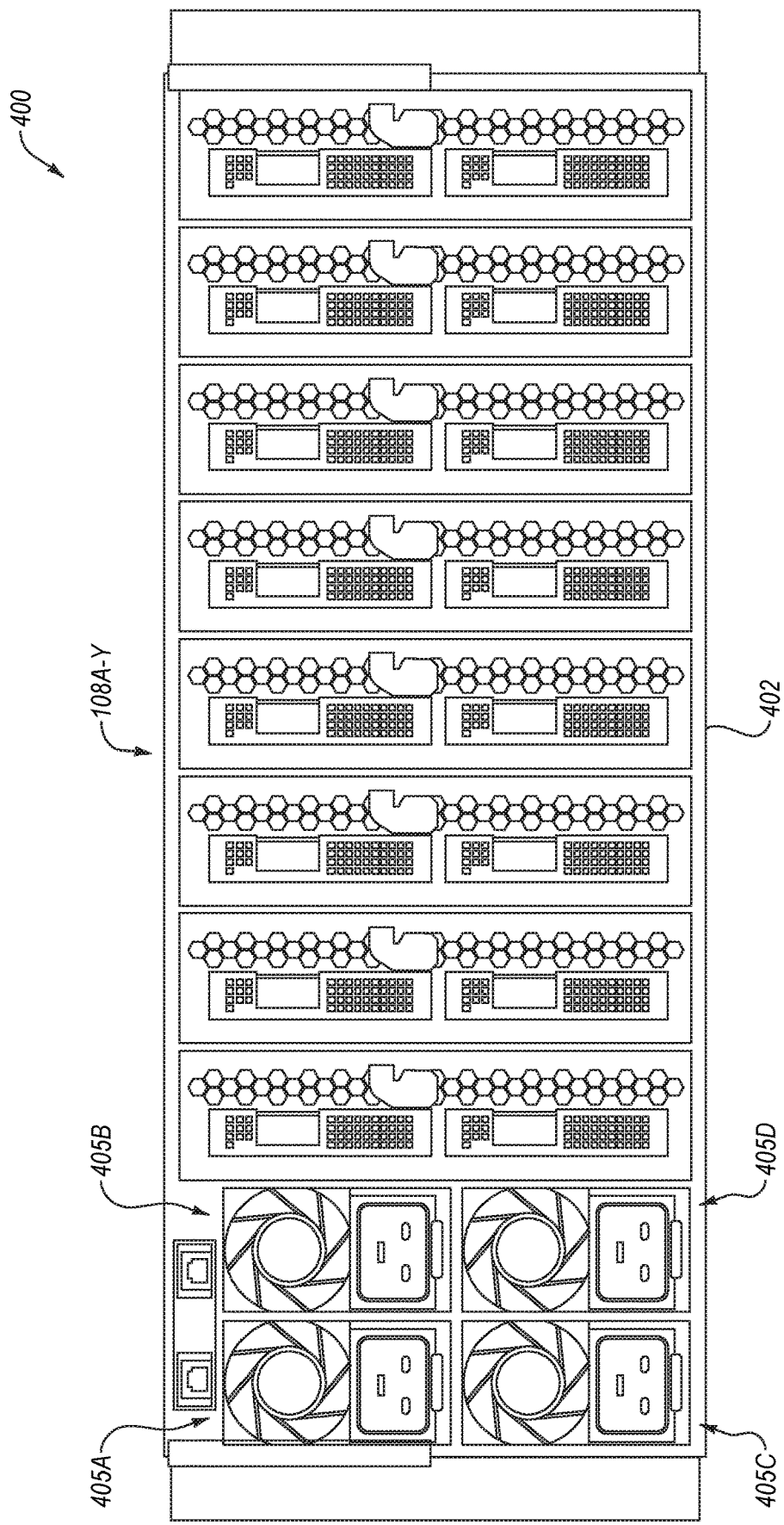
FIG. 4D illustrates a back view of a storage server, in accordance with embodiments of the present disclosure.
Figure 4E:
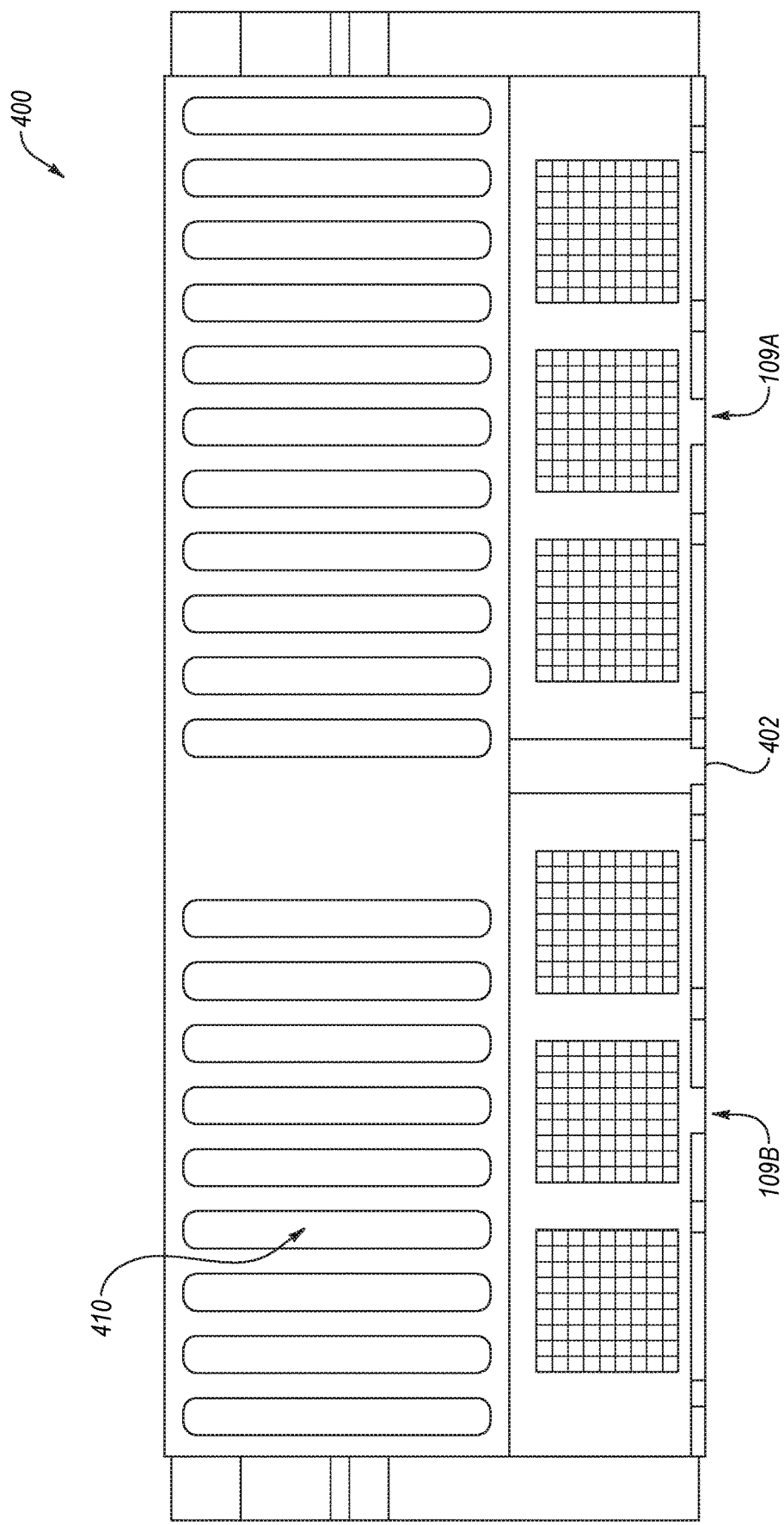
FIG. 4E illustrates a front view of a storage server, in accordance with embodiments of the present disclosure.

FIGS. 4A-E illustrate various views of a storage server 400, in accordance with embodiments of the present disclosure. In some embodiments, storage server 400 corresponds to storage server 150 of FIG. 1. FIG. 4A illustrates an isometric view of storage server 400 with a closed drive tray 410, in accordance with embodiments of the present disclosure. FIG. 4B illustrates an isometric view of storage server 400 with an open drive tray 410, in accordance with embodiments of the present disclosure. FIG. 4C illustrates a top view of storage server 400 with a closed drive tray 410, in accordance with embodiments of the present disclosure. FIG. 4D illustrates a back view of storage server 400, in accordance with embodiments of the present disclosure. FIG. 4E illustrates a front view of storage server 400, in accordance with embodiments of the present disclosure.

Storage server 400 includes a chassis 402 that houses components of the storage server 400. Storage server 400 may have a form factor of a blade server in embodiments. In one embodiment, the storage server has a height of three rack units (RU) to four RU, where an RU has a height of about 1.75 inches. In one embodiment, the chassis has a height of about 7 inches.

Components housed within the chassis include SSDs 150A-Z, fan FRUs 412A-N, fabrics 190A, 190B, a midplane 408, IO controllers 108A-Y, and power supply units (PSUs) 405A-D. In embodiments, each of the SSDs 150A-Z, PSUs 405A-D, fan FRUs 412A-N, fabrics 190A-B, and IO controllers 108A-Y is removable and replaceable without affecting the operation of any other component (e.g., without affecting the operation of any SSD 150A-Z, PSU 405A-D, fan FRU 412A-N, fabric 190A-B, or IO controller 108A-Y other than the one being replaced or serviced). In one embodiment, any type of component selected from the plurality of SSDs, the plurality of IO controllers, the plurality of fabrics, the plurality of PSUs and the plurality of fan FRUs is replaceable without affecting any other type of component selected from the plurality of SSDs, the plurality of IO controllers, the plurality of fabrics, the plurality of PSUs and the plurality of fan FRUs. In one embodiment, each of the SSDs 150A-Z, PSUs 405A-D, fan FRUs 412A-N, fabrics 190A-B, and IO controllers 108A-Y is removable and replaceable without moving the chassis 402 relative to a rack to which it is mounted. In embodiments, the storage server 400 is configured to be serviced without moving the chassis 402 relative to the rack. The storage server 400 may be configured such that cables that connect to the storage server are not supported by a cable arm.

Storage server 400 includes multiple IO controllers 108A-Y. In one embodiment, the storage server 400 includes 8 IO controllers, as shown. Alternatively, storage server 400 may include other numbers of IO controllers 108A-Y. IO controllers 108A-Y are connected to mid-plane 408 in embodiments. Each IO controller 108A-Y is an FRU that can be removed from the back of the of the storage server 400. In one embodiment, the IO controllers 108A-Y are hot swappable, meaning that they can be removed and replaced while storage server is in operation. In one embodiment, IO controllers 108A-Y are horizontally inserted into the back of the storage server. IO controllers 108A-Y may be positioned above and/or behind mid-plane 408 and to the side of one or more power supply units 405A-D. In embodiments, IO controllers 108A-Y can be removed from chassis without moving the chassis 402 relative to a rack to which it is mounted.

In some embodiments, the storage server 400 includes multiple slots each configured to receive an IO controller 180A-Y. In some embodiments, a single IO controller may occupy multiple slots. For example, one IO controller may occupy two or three of the IO controller slots. In this manner there is no limitation in terms of size or power consumption for IO controllers. If, for example, a certain size and power consumption is allocated to each slot, then an IO controller may be used that exceeds the size and power consumption associated with a single slot by using up multiple slots. This enables some IO controllers to be much more powerful and/or large than other IO controllers, and consume, for example, 2× or 3× of the power of other IO controllers that use a single slot. This provides a lot of flexibility and future system expansion capabilities and enables the system architecture to be used for a much longer period of time than traditional fixed servers with limited expansion capabilities.

Storage server 400 includes multiple PSUs 405A-D. In one embodiment, the storage server 400 includes 4 PSUs, as shown. A first pair of PSUs (e.g., PSU 405A and PSU 405B) may power the storage server, and a second pair of PSUs (e.g., PSU 405C and PSU 405D) may also power storage server 400. A first PSU from the first pair of PSUs and a first PSU from the second pair of PSUs may be connected with a first power source (e.g., a first AC power source), and a second PSU from the first pair of PSUs and a second PSU from the second pair of PSUs may be connected with a second power source (e.g., a second AC power source). Thus, if one of the power sources fails, the remaining two PSUs may still power the storage server 400, and if any of the PSUs fails, the remaining PSUs may still power the storage server 400, and if a power source fails, and a PSU on the other power source fails, there is still sufficient power from the single remaining PSU to power the storage server for at least a limited amount of time. In one embodiment, storage server 400 includes N+1 PSUs 405A-D, where N is equal to a number of planes (e.g., backplanes and/or midplanes) in the storage server.

In one embodiment, each PSU 450A-D is an FRU that can be removed from the back of the storage server 400. In one embodiment, the PSUs 405A-D are hot swappable. In one embodiment, PSUs 405A-D are horizontally inserted into the back of the storage server. PSUs 405A-D may be positioned to the side of IO controllers 108A-Y. In embodiments, PSUs 405A-D can be removed from chassis 402 without moving the chassis 402 relative to a rack to which it is mounted.

Storage server 400 includes a rail that is connected to a slidable drive tray 410. Slidable drive tray 410 is at a front and top of the chassis 402 in one embodiment, as shown. Slidable drive tray 410 is therefore coupled to the chassis, and is slidable along a chassis axis (e.g., a horizontal axis that extends from front to back of the storage server 400) between an open position and a closed position. The open position of the slidable tray 410 is illustrated in FIG. 4B, and the closed position of the slidable tray 410 is illustrated in FIG. 4A. The storage server 450 includes a plurality of solid state drives (SSDs) 150A-Z mounted to the slidable tray 410, wherein the plurality of SSDs 150A-Z are vertically mounted into the slidable tray 410 and are accessible while the slidable tray 410 is in the open position. Slidable tray 410 may include one or more PCB mounted thereto, and SSDs 510A-Z may plug into the one or more PCBs. SSDs 150A-Z may have the same form factor or different form factors. One or more of SSDs 410 may be 2.5" dual port NVMe drives. One or more of SSDs 150A-Z may be enterprise and data center form factor (EDSFF) drives. Alternatively, or additionally, one or more of the SSDs 150A-Z may be NGSFF drives.

SSDs 150A-Z having varied form factors may be supported by the storage server 400. In embodiments, different slidable trays may be used, based on the drive form factor that is desired. In order to switch the drive form factor to be used, a first slidable tray (e.g., that supports enterprise and data center SSD form factor (EDSFF)) may be removed and replaced by a second slidable tray that supports drives of a different form factor (e.g., next generation small form factor (NGSFF)).

Storage server 400 may include an internal cable management support with cables (not shown) connecting the plurality of SSDs 150A-N to the mid-plane 408, wherein the internal cable management support and included cables enables the slidable tray 410 and the plurality of SSDs 150A-Z mounted thereto to be moved to the open position without moving the chassis 402 relative to the rack to which it is mounted. Each of the SSDs 150A-Z is an FRU, and while the slidable tray 410 is in the open position, any of the SSDs 150A-Z may be vertically removed from the slidable tray 410 and replaced by a new SSD. Each SSD may be hot swappable.

In one embodiment, one or more of the SSDs 150A-Z are removable horizontally from the front of the chassis 402 without sliding the slidable tray 410 to the open position. In one embodiment, the SSDs 150A-Z are front-accessible enterprise and data center form factor (EDSFF) drives, and can be replaced without sliding the slidable tray to the open position.

Storage server 400 may include multiple fan FRUs 412A-N connected to the slidable tray 410. The plurality of fan FRUs 412A-N are configured to cool the plurality of SSDs 150A-Z, wherein each fan FRU of the plurality of fan FRUs is accessible while the slidable tray is in the open position and is removable from the slidable tray without moving the chassis relative to the rack. Each of the fan FRUs 412A-N may be vertically mounted to the slidable tray and vertically removable from the slidable tray 410. Each fan FRU 412A-N may be hot swappable. In one embodiment, as shown, fan FRUs 412A-N are positioned at a back of the slidable tray 410 behind SSDs 150A-Z.

Storage server 400 includes fabric 190A and fabric 190B. Each of the fabrics 190A-B may be connected to mid-plane 408. In one embodiment, fabrics 190A-B plug into connectors 409A-B of mid-plane 408. Fabrics 190A-B may be horizontally mounted to the chassis 402, and may be removed by horizontally sliding them out of the front of the chassis 402. In one embodiment, each fabric 190A-B includes a PCB on a sled that can be slid horizontally out of the front of the chassis 402. In one embodiment, each of the fabrics 190A-B is a field replaceable unit (FRU) that is removable from a front of the chassis without moving the chassis relative to the rack. The fabrics 190A-B may be positioned side-by-side and beneath the slidable tray 410. Each of the fabrics 190A-B may be hot swappable.

Figure 5A:
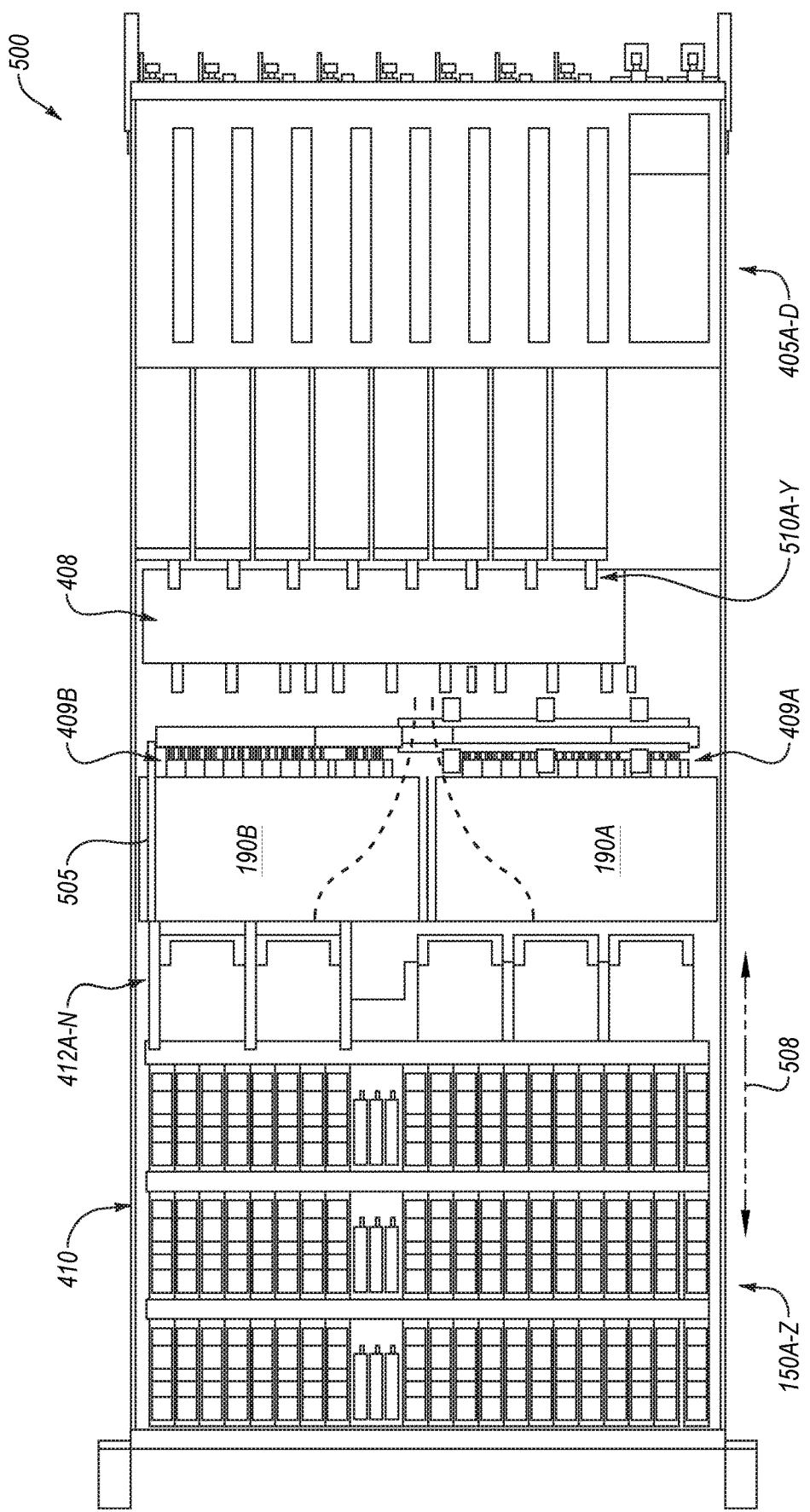
FIG. 5A illustrates a top view of a storage server with a closed drive tray, in accordance with embodiments of the present disclosure.
Figure 5B:
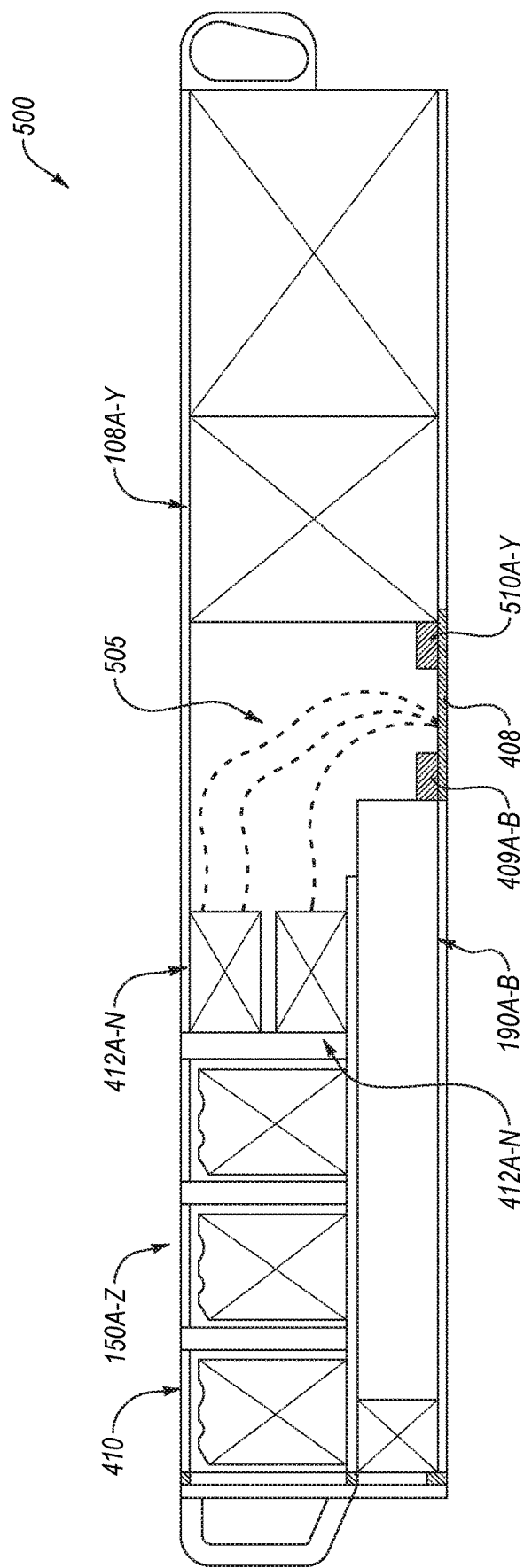
FIG. 5B illustrates cross-sectional side view of a storage server with a closed drive tray, in accordance with embodiments of the present disclosure.

FIG. 5A illustrates a top view of a storage server 500 with a closed drive tray, in accordance with embodiments of the present disclosure. FIG. 5B illustrates cross-sectional side view of storage server 500 with a closed drive tray, in accordance with embodiments of the present disclosure.

Storage server 500 may correspond to storage server 105 of FIG. 1 in embodiments and/or to storage server 400 of FIGS. 4A-E in embodiments. As shown slidable tray 410 is slidable along axis 508. Additionally, an internal cable management support 505 includes multiple cables that connect SSDs 150A-Z to mid-plane 408. The cables may be high-speed cables, and may have a smaller loss than PCB connections. The internal cable management support and associated cables provide enough slack (extra length of cables) that permits the slidable tray 410 (also referred to as an extendable storage tray) to slide between the closed and open positions while SSDs 150A-Z remain connected to mid-plane 408. Mid-plane 408 includes multiple connectors 409A-B that connect mid-plane to fabrics 190A-B and multiple connectors 510A-Y that connect mid-plane 408 to IO controllers 108A-Y.

Figure 6:
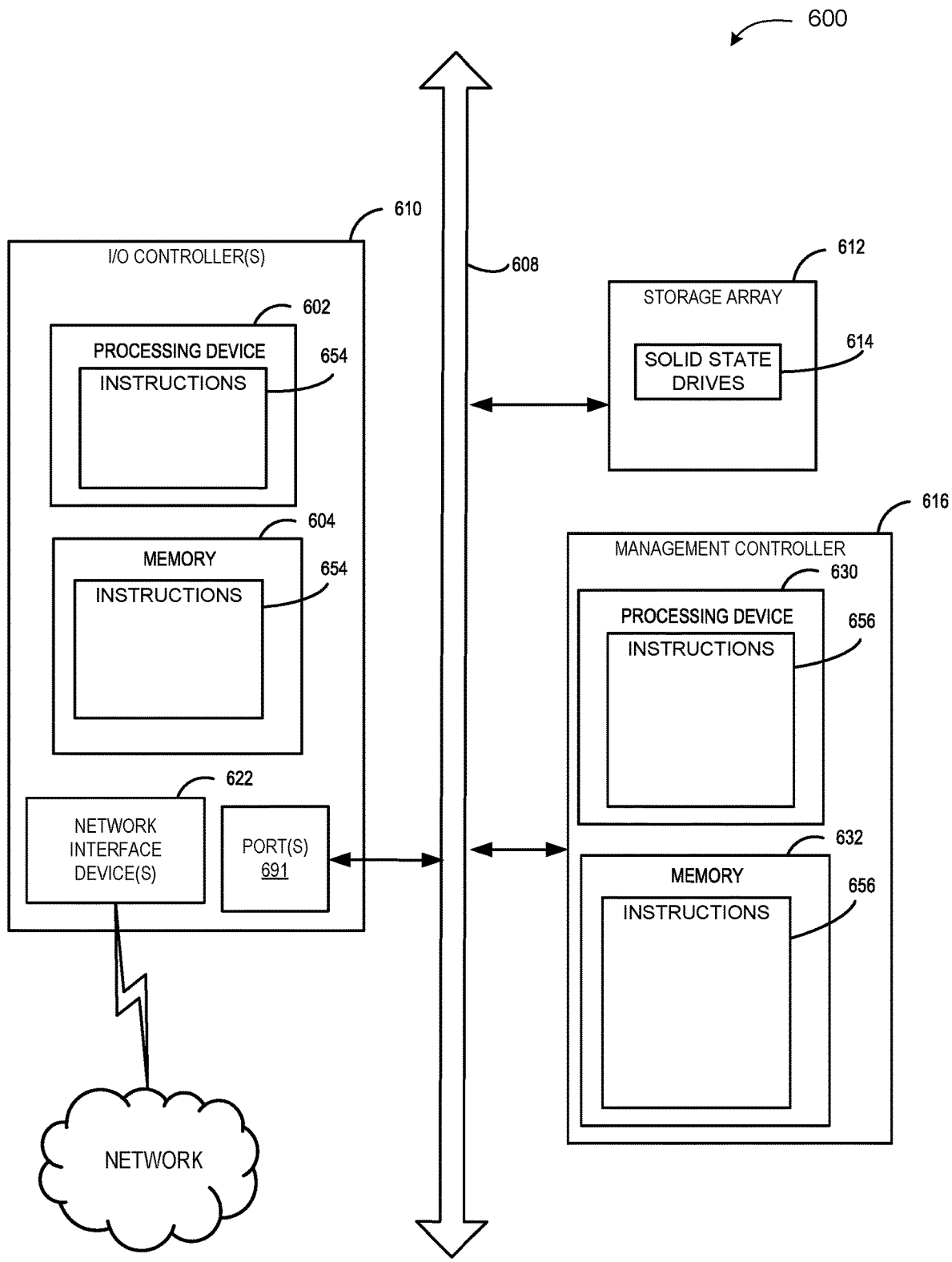
FIG. 6 illustrates an example computing device, in accordance with one embodiment.

FIG. 6 illustrates a diagrammatic representation of a machine in the example form of a computing device 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a hardware storage server, and may provide storage to hosts using one or more of a storage area network (SAN) or network attached storage (NAS) methodology. Further, while only a single machine is illustrated, the term "machine" shall also be taken to include any collection of machines (e.g., computers) that individually or jointly execute a set (or multiple sets) of instructions to perform any one or more of the methodologies discussed herein. The computing device 600 may correspond to storage server 105 in embodiments.

The example computing device 600 includes one or more IO controllers 610, a storage array 612, and a management controller 616 (or multiple management controllers 616), which communicate with each other via an interconnection network 608. Interconnection network 608 may include one or more switches (e.g., of first and second switch layers 110A-B, 112A-B of FIG. 1) and one or more storage fabrics (also referred to as backplane fabrics). Each storage fabric includes hardware (e.g., switches, etc.) that connects IO controllers 610 to SSDs 614. Each storage fabric may include a fabric board (e.g., a printed circuit board (PCB) that includes multiple hardware components. Each storage fabric enables any IO controller 610 to connect to any SSD 614. Each storage fabric may be independent of other storage fabrics, using its own hardware, ports, connections, etc. that are distinct from those used by the other storage fabrics. Accordingly, if any component in a storage fabric fails and causes that storage fabric to fail, the IO controllers 610 may continue to maintain connections to the SSDs 614 via an alternative storage fabric.

Each IO controller 610 represents a device configured to connect one or more host computing devices to one or more SSDs (e.g., IO controller 108A-Y of FIG. 1). An IO controller 610 includes a processing device 602, and a memory 604 (e.g., read-only memory (ROM), flash memory, dynamic random access memory (DRAM) such as synchronous DRAM (SDRAM) or Rambus DRAM (RDRAM), etc.). The IO controller 610 may further include one or more network interface devices 622 to connect to a network. The IO controller 610 may additionally include one or more ports (e.g., PCI or PCIe ports) to connect the IO controller 610 to interconnection network 608. In one embodiment, each IO controller 610 is a system on a chip (SoC) including processing device 602, memory 604, one or more ports 691, and one or more network interface devices 622.

Management controller 616 represents a device configured to manage a storage fabric. Management controller 616 may include a memory 632 having instructions 656 and a processing device 630 that loads and executes those instructions 656. Memory 632 may be read-only memory (ROM), flash memory, dynamic random access memory (DRAM) such as synchronous DRAM (SDRAM) or Rambus DRAM (RDRAM), etc. In one embodiment, management controller 616 is a system on a chip (SoC) including processing device 630 and memory 632.

Processing device 602 and/or processing device 630 represents one or more general-purpose processors such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), graphical processing unit (GPU), network processor, or the like. Processing device 602 is configured to execute processing logic (e.g., instructions 654) for performing operations discussed herein.

The memory 604 may be a machine-readable storage medium (or more specifically a computer-readable storage medium) on which is stored one or more sets of instructions 654 embodying any one or more of the methodologies or functions described herein. The instructions 654 may also reside, completely or at least partially, within the processing device 602 during execution thereof by the IO controller 610, the processing device 602 also constituting computer-readable storage media. Alternatively, or additionally, the instructions 654 may be resident on a solid state storage drive (e.g., a solid state storage drive 614) and/or a hard disk drive connected to interconnection network 608.

While the computer-readable storage medium is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any non-transitory medium that is capable of storing or encoding a set of instructions for execution by the machine and that cause the machine to perform any one or more of the methodologies described herein. The term "computer-readable storage medium" shall accordingly be taken to include, but not be limited to, solid-state memories, and optical and magnetic media.

The storage array 612 represents a device that contains a group of solid state drives (SSDs) 614. Storage array 612 may arrange SSDs 614 into logical redundant storage containers, or a redundant array of independent disks (RAID). The storage array 612 may distribute data across the SSDs 614 in one of several RAID levels to provide different levels of redundancy and performance. In some implementations, storage array 612 may include one group of SSDs 614 for data and another group of SSDs 614 for recovery purposes. SSDs 614 may be SAS/SATA drives, non-volatile memory express (NVMe) drives, small computer system interface (SCSI) over PCIe (SOP) drives, or solid state drives that communicate using different protocols. The number of SSDs 614 included in storage array 612 may be less than 10 to more than 100. The SSDs 614 may have the same or different storage capacities.

The management controller 616 may be a device configured to perform particular operations with regards to management of the array of SSDs 614 in storage array 612. Management controller 616 may include a volatile and/or non-volatile memory 632 to store one or more sets of instructions 654 embodying any one or more of the methodologies or functions described herein.

Figure 7:
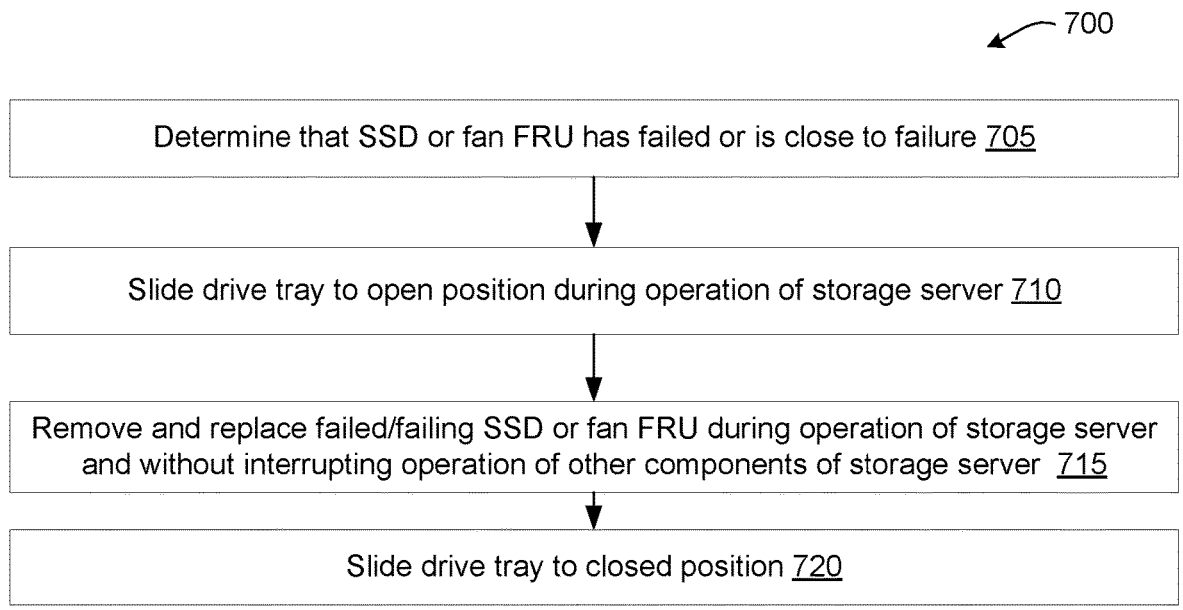
FIG. 7 illustrates one embodiment of a method for replacing a fan FRU and/or an SSD in a storage server.

FIG. 7 illustrates one embodiment of a method 700 for replacing a fan FRU and/or an SSD in a storage server. At block 705 of method 700, a determination is made that an SSD and/or fan FRU has failed or is close to failure. Alternatively, a determination may be made that an SSD or fan FRU is otherwise to be replaced. At block 710, a drive tray is slid to an open position during operation of the storage server. The drive tray may be slid to the open position without moving a chassis of the storage server relative to a rack on which it is mounted. At block 715, the failed or failing SSD and/or fan FRU (or other SSD and/or fan FRU to be replaced) are removed and replaced during operation of the storage server and without interrupting operations of other components of the storage server. At block 720, the drive tray is slid back to the closed position.

Figure 8:
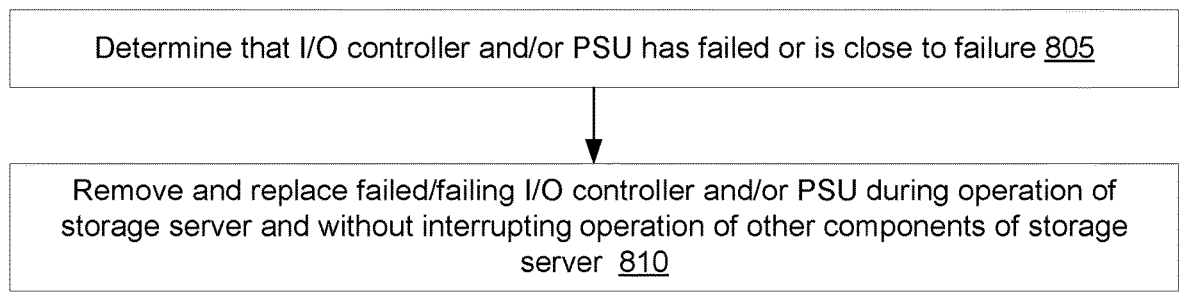
FIG. 8 illustrates one embodiment of a method for replacing an IO controller and/or a power supply unit in a storage server.

FIG. 8 illustrates one embodiment of a method 800 for replacing an IO controller and/or a PSU in a storage server. At block 805 of method 800, a determination is made that an IO controller and/or PSU has failed or is close to failure. Alternatively, a determination may be made that an IO controller or PSU is otherwise to be replaced. For example, one or more IO controllers may be upgraded to more powerful IO controllers with more processors, greater processing power, greater memory, and so on. At block 810, the failed or failing IO controller(s) and/or PSUs (or other IO controller or PSU to be replaced) are removed and replaced during operation of the storage server and without interrupting operations of other components of the storage server. The IO controllers and/or PSUs may be removed and replaced from the back of the storage server without moving the chassis of the storage server relative to a rack to which it is mounted.

Figure 9:
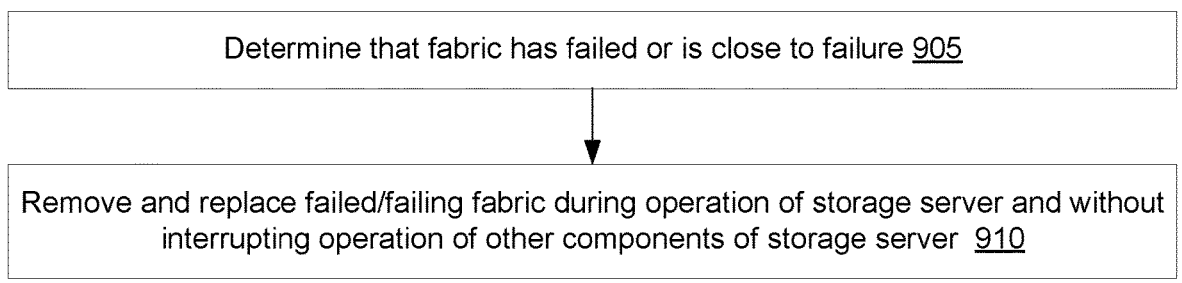
FIG. 9 illustrates one embodiment of a method for replacing a fabric in a storage server.

FIG. 9 illustrates one embodiment of a method 900 for replacing a fabric in a storage server. At block 905 of method 900, a determination is made that a fabric has failed or is close to failure. Alternatively, a determination may be made that a fabric is otherwise to be replaced. For example, a fabric may be upgraded to more powerful fabric or to a fabric that supports a greater number of SSDs and/or IO controllers. At block 910, the failed or failing fabric (or other fabric to be replaced) are removed and replaced during operation of the storage server and without interrupting operations of other components of the storage server. The fabric may be removed and replaced from the front of the storage server without moving the chassis of the storage server relative to a rack to which it is mounted.

The modules, components and other features described herein can be implemented as discrete hardware components or integrated in the functionality of hardware components such as ASICS, FPGAs, DSPs, SoCs or similar devices. In addition, the modules can be implemented as firmware or functional circuitry within hardware devices. Further, the modules can be implemented in any combination of hardware devices and software components, or only in software.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving", "allocating", "sending", "generating", "writing", "determining", "retrieving", or the like, refer to the actions and processes of a processing device or processing logic that manipulates and transforms data represented as physical (e.g., electronic) quantities within registers and memories into other data similarly represented as physical quantities within the memories or registers or other such information storage devices.

Embodiments of the disclosure also relate to an apparatus for performing the operations herein. This apparatus may be specially constructed for the required purposes, or it may comprise a general purpose computer selectively activated or reconfigured by a computer program or firmware stored in the computer. Such a computer program or firmware may be stored in a computer readable storage medium, such as, but not limited to, any type of disk including optical disks, CD-ROMs, and magnetic-optical disks, read-only memories (ROMs), random access memories (RAMs), electrically programmable read only memories (EPROMs), electrically erasable programmable read only memories (EEPROMs), magnetic or optical cards, or any type of media suitable for storing electronic instructions. The term "computer-readable storage medium" shall also be taken to include any medium other than a carrier wave that is capable of storing or encoding a set of instructions for execution by the computing device that cause the computing device to perform any one or more of the methodologies of the present disclosure.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A storage server comprising:
   a chassis configured to mount to a rack;
   a slidable tray coupled to the chassis, wherein the slidable tray is slidable along an axis of the chassis between an open position and a closed position;
   a plurality of solid state drives (SSDs) mounted to the slidable tray, wherein the plurality of SSDs are vertically mounted into the slidable tray and are accessible while the slidable tray is in the open position;
   a mid-plane coupled to the chassis;
   an internal cable management support comprising a plurality of cables connecting the plurality of SSDs to the mid-plane, wherein the internal cable management support enables the slidable tray and the plurality of SSDs mounted thereto to be moved to the open position without moving the chassis relative to the rack;
   a plurality of input/output (IO) controllers coupled to the mid-plane, wherein each of the plurality of IO controllers is to read from and write to one or more of the plurality of SSDs; and
   a plurality of fabrics coupled to the mid-plane, each fabric of the plurality of fabrics comprising a management controller, a first switch layer and a second switch layer, wherein:
   the first switch layer comprises:
      a first switch having a first plurality of connections to the plurality of IO controllers, each connection of the first plurality of connections having a first number of lanes; and
      a second switch having a second plurality of connections to the plurality of IO controllers, each connection of the second plurality of connections having the first number of lanes; and
   the second switch layer comprises:
      a third switch having:
         a third connection to the first switch, the third connection having a second number of lanes that is greater than the first number of lanes:
         a fourth connection to the second switch, the fourth connection having the second number of lanes; and
         a fifth plurality of connections to a first subset of the plurality of SSDs, each connection of the fifth plurality of connections having a third number of lanes that is less than the first number of lanes; and
      a fourth switch having:
         a sixth connection to the first switch, the sixth connection having the second number of lanes;
         a seventh connection to the second switch, the seventh connection having the second number of lanes; and
         an eighth plurality of connections to a second subset of the plurality of SSDs, each connection of the eighth plurality of connections having the third number of lanes.

2. The storage server of claim 1, wherein each IO controller of the plurality of IO controllers is a field replaceable unit (FRU) that is removable from a back of the chassis without moving the chassis relative to the rack, wherein the plurality of IO controllers are hot swappable.

3. The storage server of claim 1, further comprising:
   a plurality of IO controller slots, each IO controller slot configured to receive an IO controller of the plurality of IO controllers, wherein at least one IO controller of the plurality of IO controllers occupies at least two IO controller slots of the plurality of IO controllers, the at least one IO controller having at least one of a) a size that is greater than one or more remaining IO controllers of the plurality of IO controllers or b) a power consumption that is greater than the one or more remaining IO controllers.

4. The storage server of claim 1, wherein each fabric of the plurality of fabrics is a field replaceable unit (FRU) that is removable from a front of the chassis without moving the chassis relative to the rack.

5. The storage server of claim 4, wherein the plurality of fabrics are hot swappable.

6. The storage server of claim 1, further comprising a plurality of fan field replaceable units (FRUs) mounted to the slidable tray, the plurality of fan FRUs configured to cool the plurality of SSDs, wherein each fan FRU of the plurality of fan FRUs is accessible while the slidable tray is in the open position and is removable from the slidable tray without moving the chassis relative to the rack.

7. The storage server of claim 1, further comprising:
   a plurality of power supply units (PSUs), wherein each PSU of the plurality of PSUs is a field replaceable unit (FRU) that is removable from a back of the chassis without moving the chassis relative to the rack.

8. The storage server of claim 1, wherein for each fabric of the plurality of fabrics the first switch layer and the second switch layer together provide a fully connected mesh topology that connects every IO controller of the plurality of IO controllers to every SSD of the plurality of SSDs.

9. The storage server of claim 1, wherein the first switch, the second switch, the third switch and the fourth switch each comprise serial computer expansion bus switches, each fabric of the plurality of fabrics further comprising:

a network switch that connects each IO controller of the plurality of IO controllers to the management controller of the fabric.

10. The storage server of claim 1, further comprising a plurality of power supply units (PSUs), and a plurality of fan field replaceable units (FRUs), wherein any type of component selected from the plurality of SSDs, the plurality of IO controllers, the plurality of fabrics, the plurality of PSUs and the plurality of fan FRUs is replaceable without affecting any other type of component selected from the plurality of SSDs, the plurality of IO controllers, the plurality of fabrics, the plurality of PSUs and the plurality of fan FRUs.

11. The storage server of claim 1, wherein the storage server is configured to be serviced without moving the chassis relative to the rack, and wherein the storage server is configured such that cables that connect to the storage server are not supported by a cable arm.

12. A storage server comprising:
a plurality of solid state drives (SSDs);
a plurality of input/output (IO) controllers, wherein each of the plurality of IO controllers is configured to read from and write to one or more of the plurality of SSDs; and
a plurality of fabrics, each fabric of the plurality of fabrics configured to provide a fully connected mesh topology that connects each of the plurality of IO controllers to each of the plurality of SSDs, each fabric of the plurality of fabrics comprising:
a management controller;
a first switch layer comprising a first plurality of switches coupled to the plurality of IO controllers, the first plurality of switches comprising:
a first switch having a first plurality of connections to the plurality of IO controllers, each connection of the first plurality of connections having a first number of lanes; and
a second switch having a second plurality of connections to the plurality of IO controllers, each connection of the second plurality of connections having the first number of lanes; and
a second switch layer comprising a second plurality of switches coupled to a) the first plurality of switches and b) the plurality of SSDs, the second plurality of switches comprising:
a third switch having:
a third connection to the first switch, the third connection having a second number of lanes that is greater than the first number of lanes;
a fourth connection to the second switch, the fourth connection having the second number of lanes; and
a fifth plurality of connections to a first subset of the plurality of SSDs, each connection of the fifth plurality of connections having a third number of lanes that is less than the first number of lanes; and
a fourth switch having:
a sixth connection to the first switch, the sixth connection having the second number of lanes;
a seventh connection to the second switch, the seventh connection having the second number of lanes; and
an eighth plurality of connections to a second subset of the plurality of SSDs, each connection of the eighth plurality of connections having the third number of lanes;

wherein the first switch layer and the second switch layer together provide the fully connected mesh topology that connects every IO controller of the plurality of IO controllers to every SSD of the plurality of SSDs.

13. The storage server of claim 12, wherein:
the first switch comprises a respective non-transparent bridge for each connection of the first plurality of connections, the third connection and the sixth connection;
the second switch comprises a respective non-transparent bridge for each connection of the second plurality of connections, the fourth connection and the seventh connection;
the third switch comprises a respective non-transparent bridge for each connection of the third connection and the fourth connection; and
the fourth switch comprises a respective non-transparent bridge for each connection of the sixth connection and the seventh connection.

14. The storage server of claim 12, wherein the plurality of fabrics comprise a first fabric and a second fabric:
the first switch further comprises a ninth connection to a first management controller of the first fabric and a tenth connection to a second management controller of the second fabric, the ninth connection and the tenth connection having the third number of lanes or a fourth number of lanes;
the second switch further comprises an eleventh connection to the first management controller of the first fabric and a twelfth connection to the second management controller of the second fabric, the eleventh connection and the twelfth connection having the third number of lanes or the fourth number of lanes;
the third switch further comprises a thirteenth connection to the first management controller of the first fabric and a fourteenth connection to the second management controller of the second fabric, the thirteenth connection and the fourteenth connection having the third number of lanes or the fourth number of lanes; and
the fourth switch further comprises a fifteenth connection to the first management controller of the first fabric and a sixteenth connection to the second management controller of the second fabric, the fifteenth connection and the sixteenth connection having the third number of lanes or the fourth number of lanes.

15. The storage server of claim 14, wherein the first number of lanes is 8 lanes, the second number of lanes is 16 lanes and the third number of lanes is 2 lanes.

16. The storage server of claim 12, wherein the plurality of SSDs comprise at least 50 SSDs arranged as a redundant array of independent disks (RAID) array, wherein two or more SSDs of the at least 50 SSDs are parity drives that provide parity information for a remainder of the at least 50 SSDs.

17. The storage server of claim 12, wherein the plurality of SSDs are arranged as a redundant array of independent disks (RAID) array having a shared zone, wherein two or more SSDs of the plurality of SSDs are configured to provide parity information for the shared zone, the two or more SSDs comprising:
a first pair of SSDs, a first SSD of the first pair of SSDs comprising first parity information and a second SSD of the first pair of SSDs comprising second parity information; and
a second pair of SSDs, a first SSD of the second pair of SSDs comprising a first copy of the first parity information and a second SSD of the second pair of SSDs comprising a first copy of the second parity information.

18. The storage server of claim 17, wherein the two or more SSDs further comprise:
a third pair of SSDs, a first SSD of the third pair of SSDs comprising a second copy of the first parity information and a second SSD of the third pair of SSDs comprising a second copy of the second parity information.

19. The storage server of claim 12, wherein the plurality of SSDs are arranged as a redundant array of independent disks (RAID) array, wherein a ratio of total capacity of the RAID array to storage space dedicated to storage of parity information for the RAID array is about 9:1 or greater.

20. The storage server of claim 12, wherein each IO controller of the plurality of IO controllers is configured to access each SSD of the plurality of SSDs in parallel with one or more other IO controllers of the plurality of IO controllers accessing the plurality of SSDs, and wherein each fabric of the plurality of fabrics is configured to remain active in parallel to each other fabric of the plurality of fabrics.

21. The storage server of claim 12, wherein the first plurality of switches and the second plurality of switches each comprise serial computer expansion bus switches, each fabric of the plurality of fabrics further comprising:
a network switch that connects each IO controller of the plurality of IO controllers to the management controller of the fabric.

\* \* \* \* \*

UNITED STATES PATENT AND TRADEMARK OFFICE
CERTIFICATE OF CORRECTION

| | | |
|---|---|---|
| PATENT NO. | : 11,288,122 B1 | Page 1 of 1 |
| APPLICATION NO. | : 17/086216 | |
| DATED | : March 29, 2022 | |
| INVENTOR(S) | : Eugene Fleisher et al. | |

It is certified that error appears in the above-identified patent and that said Letters Patent is hereby corrected as shown below:

On the Title Page

Item (57), correct ABSTRACT to read:
"A storage server includes a plurality of solid state drives (SSDs), a plurality of input/output (IO) controllers, and a plurality of fabrics. Each fabric is configured to provide a fully connected mesh topology that connects each of the plurality of IO controllers to each of the plurality of SSDs. Each fabric comprises a management controller, a first switch layer comprising a first plurality of switches coupled to the plurality of IO controllers, and a second switch layer comprising a second plurality of switches coupled to a) the first plurality of switches and b) the plurality of SSDs. The first switch layer and the second switch layer together provide the fully connected mesh topology that connects every IO controller of the plurality of IO controllers to every SSD of the plurality of SSDs."

Signed and Sealed this
Thirteenth Day of September, 2022

Katherine Kelly Vidal
*Director of the United States Patent and Trademark Office*